United States Patent
Huang (12)

(10) Patent No.: US 11,894,293 B2
(45) Date of Patent: *Feb. 6, 2024

(54) CIRCUIT STRUCTURE AND ELECTRONIC STRUCTURE

(71) Applicant: Advanced Semiconductor Engineering, Inc., Kaohsiung (TW)

(72) Inventor: Wen Hung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 179 days.

This patent is subject to a terminal disclaimer.

(21) Appl. No.: 17/384,290

(22) Filed: Jul. 23, 2021

(65) Prior Publication Data
US 2023/0025850 A1    Jan. 26, 2023

(51) Int. Cl.
*H01L 23/48* (2006.01)
*H01L 23/498* (2006.01)
*H01L 21/48* (2006.01)

(52) U.S. Cl.
CPC .... *H01L 23/49833* (2013.01); *H01L 21/4857* (2013.01); *H01L 23/49822* (2013.01)

(58) Field of Classification Search
CPC ......... H01L 23/49833; H01L 23/49822; H01L 23/5385
See application file for complete search history.

(56) References Cited

U.S. PATENT DOCUMENTS

| | | | | |
|---|---|---|---|---|
| 10,026,671 B2* | 7/2018 | Yu | ............................ | H01L 23/36 |
| 11,538,760 B2* | 12/2022 | Lu | ........................ | H01L 23/5383 |
| 11,569,175 B2* | 1/2023 | Mun | ................... | H01L 23/49838 |
| 2015/0279816 A1* | 10/2015 | Chen | ...................... | H01L 24/80 |
| | | | | 257/774 |
| 2015/0364410 A1* | 12/2015 | Hando | ............. | H01L 23/49811 |
| | | | | 174/126.1 |
| 2018/0053723 A1* | 2/2018 | Hu | ....................... | H01L 25/0655 |
| 2018/0294212 A1* | 10/2018 | Chen | ..................... | H01L 21/481 |
| 2019/0139949 A1* | 5/2019 | Liu | ........................ | H01L 33/44 |
| 2020/0105694 A1* | 4/2020 | Ko | ........................ | H01L 24/09 |
| 2020/0365563 A1* | 11/2020 | Chen | ..................... | H01L 21/565 |
| 2022/0068822 A1* | 3/2022 | Mun | .................... | H01L 25/0657 |
| 2022/0199509 A1* | 6/2022 | Huang | ............... | H01L 23/5383 |
| 2022/0310577 A1* | 9/2022 | Lee | ...................... | H01L 25/0652 |
| 2023/0178470 A1* | 6/2023 | Lee | ......................... | H01L 21/56 |
| | | | | 257/741 |
| 2023/0178492 A1* | 6/2023 | Mun | .................... | H01L 25/0657 |
| | | | | 257/678 |

* cited by examiner

*Primary Examiner* — Nicholas J Tobergte
(74) *Attorney, Agent, or Firm* — FOLEY & LARDNER LLP

(57) ABSTRACT

A circuit structure and an electronic structure are provided. The circuit structure includes a low-density conductive structure, a high-density conductive structure and an electrical connection structure. The high-density conductive structure is disposed on the low-density conductive structure. The electrical connection structure extends through the high-density conductive structure and is electrically connected to the low-density conductive structure. The electrical connection structure includes a shoulder portion.

17 Claims, 27 Drawing Sheets

CIRCUIT STRUCTURE AND ELECTRONIC STRUCTURE

BACKGROUND

1. Field of the Disclosure

The present disclosure relates to a circuit structure, an electronic structure and a manufacturing method, and to a circuit structure including at least one conductive via, an electronic structure including the same, and a method for manufacturing the same.

2. Description of the Related Art

Along with the rapid development in electronics industry and the progress of semiconductor processing technologies, semiconductor chips are integrated with an increasing number of electronic components to achieve improved electrical performance and additional functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase in size. Thus, a thickness and a warpage of the semiconductor substrate may correspondingly increase, and a yield of the semiconductor substrate may decrease.

SUMMARY

In some embodiments, a circuit structure includes a low-density conductive structure, a high-density conductive structure and an electrical connection structure. The high-density conductive structure is disposed on the low-density conductive structure. The electrical connection structure extends through the high-density conductive structure and is electrically connected to the low-density conductive structure. The electrical connection structure includes a shoulder portion.

In some embodiments, an electronic structure includes a lower conductive structure, an upper conductive structure and an electrical connection structure. The upper conductive structure is disposed on the lower conductive structure. The intermediate layer bonds the upper conductive structure and the lower conductive structure. The electrical connection structure electrically connects the upper conductive structure and the lower conductive structure. The electrical connection structure includes a shoulder portion located outside the lower conductive structure.

In some embodiments, an electronic structure includes an interconnection structure, a first conductive traces structure, a second conductive traces structure and a conductive via. The first conductive traces structure is disposed adjacent to a first side of the interconnection structure. The second conductive traces structure is disposed adjacent to second side of the interconnection structure and is apart from first conductive traces structure by a distance. The conductive via is disposed adjacent to the first side of the interconnection structure, tapers toward the interconnection structure and contacts a surface of the interconnection structure. A sum of the distance and a length of the conductive via is greater than a width of the conductive via.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
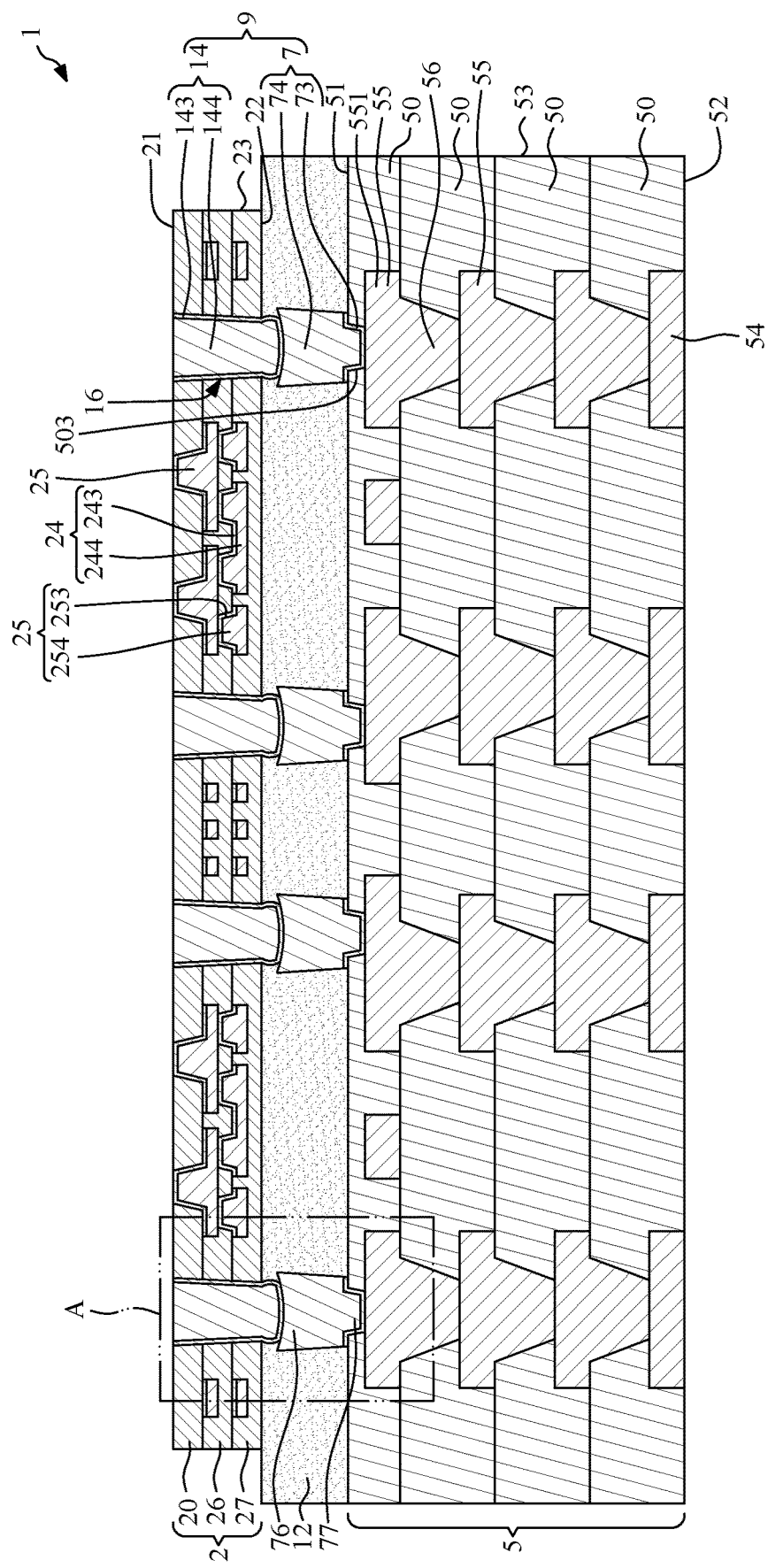
FIG. 1 illustrates a cross-sectional view of a circuit structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
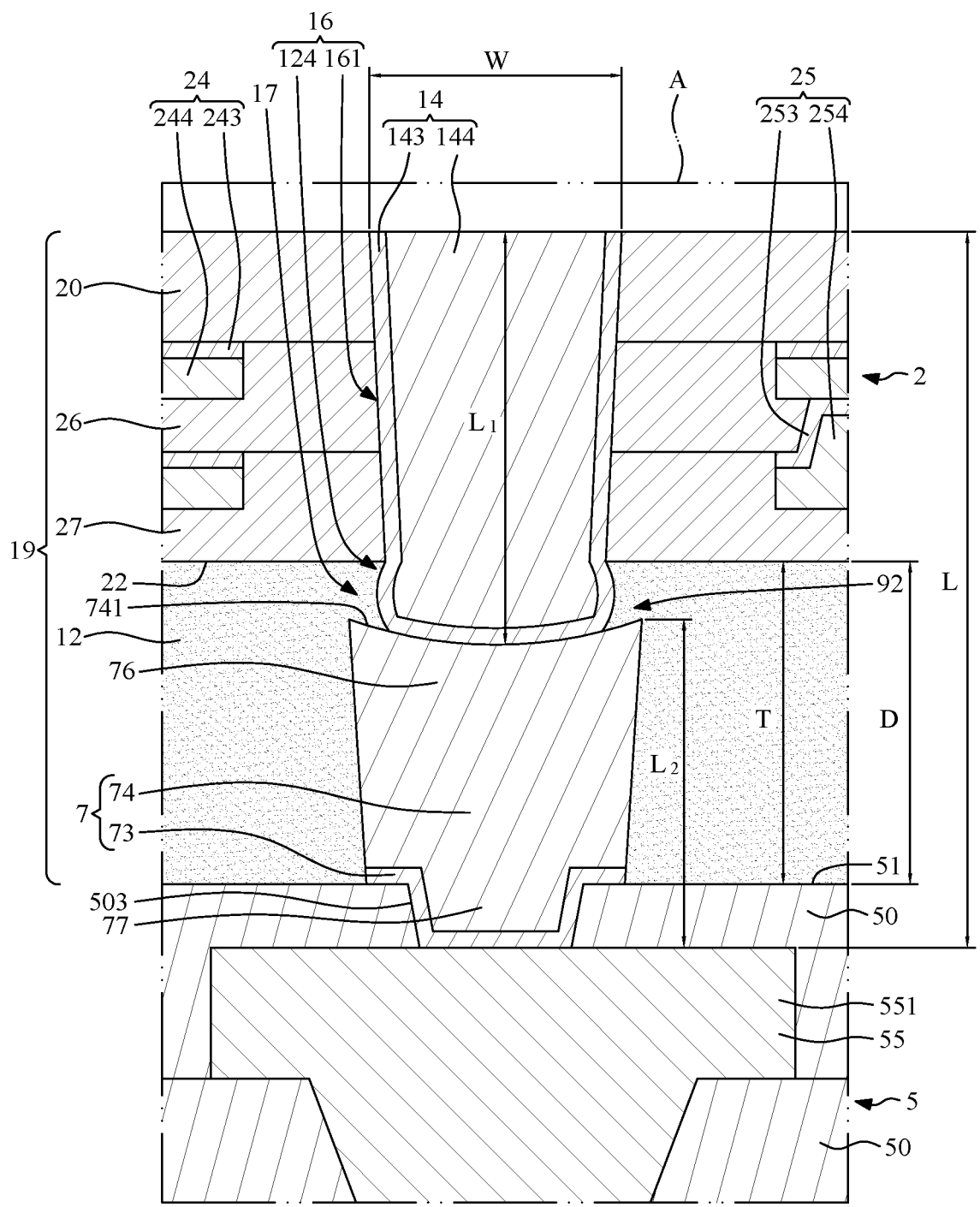
FIG. 2 illustrates a partially enlarged view of a region "A" in FIG. 1.

FIG. 1 illustrates a cross-sectional view of a circuit structure 1 according to some embodiments of the present disclosure. FIG. 2 illustrates a partially enlarged view of a region "A" in FIG. 1. The circuit structure 1 may include an upper conductive structure (e.g., a conductive structure) 2, a lower conductive structure 5, an intermediate layer 12 and at least one electrical connection structure 9 (including, for example, a conductive via 14 and an interconnection structure 7). The circuit structure 1 may be also referred to as "an electronic structure" or "a wiring structure".

The upper conductive structure 2 is disposed on the lower conductive structure 5, and includes at least one dielectric layer (including, for example, a first dielectric layer 20, a second dielectric layer 26 and a third dielectric layer 27), at least one circuit layer 24 (formed of a metal, a metal alloy, or other conductive material) in contact with the dielectric layer, and a plurality of inner conductive vias 25. In some embodiments, the upper conductive structure 2 may be similar to a coreless substrate, and may be a bumping level redistribution structure. The upper conductive structure 2 may be also referred to as "a high-density conductive structure", "a high-density stacked structure", or "a first conductive traces structure". The circuit layer 24 of the upper conductive structure 2 may be also referred to as "a high-density circuit layer". In some embodiments, a density of a circuit line (including, for example, a trace or a pad) of the high-density circuit layer is greater than a density of a circuit line of a low-density circuit layer. That is, the count of the circuit line (including, for example, the trace or the pad) in a unit area of the high-density circuit layer is greater than the count of the circuit line in an equal unit area of the low-density circuit layer, such as about 1.2 times or greater, about 1.5 times or greater, or about 2 times or greater, or about 3 times or greater. Alternatively, or in combination, a line width/line space (L/S) of the high-density circuit layer is less than an L/S of the low-density circuit layer, such as about 90% or less, about 50% or less, or about 20% or less. Further, the conductive structure that includes the high-density circuit layer may be designated as the "high-density conductive structure", and the conductive structure that includes the low-density circuit layer may be designated as a "low-density conductive structure".

The upper conductive structure 2 has a top surface 21, a bottom surface 22 opposite to the top surface 21, and a lateral surface 23 extending between the top surface 21 and the bottom surface 22. As shown in FIG. 1, the dielectric layers 20, 26, 27 are stacked on one another. For example, the first dielectric layer 20 may be the topmost dielectric layer. In some embodiments, a material of the dielectric layers 20, 26, 27 is transparent, and can be seen through or detected by human eyes or machine. In some embodiments, a transparent material of the dielectric layers 20, 26, 27 has a light transmission for a wavelength in the visible range (or other pertinent wavelength for detection of a mark) of at least about 60%, at least about 70%, or at least about 80%. In some embodiments, a material of the dielectric layers 20, 26, 27 may be made of a cured photoimageable dielectric (PID) material such as epoxy or polyimide (PI) including photoinitiators.

The circuit layer 24 may be a fan-out circuit layer or a redistribution layer (RDL), and an L/S of the circuit layer 24 may be less than about 10 μm/10 μm, less than or equal to 8 μm/8 μm, less than or equal to 5 μm/5 μm, less than or equal to 3 μm/3 μm, less than or equal to about 2 μm/about 2 μm, or less than or equal to about 1.8 μm/about 1.8 μm. In some embodiments, the circuit layer 24 is embedded in the corresponding dielectric layers 20, 26, 27. In some embodiments, the circuit layer 24 may include a seed layer 243 and a conductive material 244 (e.g., a plating metallic material) disposed on the seed layer 243. As shown in FIG. 1, the bottommost circuit layer 24 is covered by the third dielectric layer 27. As illustrated in the embodiment of FIG. 1, a horizontally connecting or extending circuit layer may be omitted in the first dielectric layer 20.

Some of the inner conductive vias 25 are disposed between two adjacent circuit layers 24 for electrically connecting the two circuit layers 24. Some of the inner conductive vias 25 are exposed from the top surface 21 of the upper conductive structure 2 (e.g., the top surface of the first dielectric layer 20). In some embodiments, each inner conductive via 25 may include a seed layer 253 and a conductive material 254 (e.g., a plating metallic material) disposed on the seed layer 253. Each inner conductive via 25 tapers upwardly along a direction from the bottom surface 22 towards the top surface 21 of the upper conductive structure 2.

The lower conductive structure 5 includes at least one dielectric layer (including, for example, four dielectric layers 50), at least one circuit layer (including, for example, three upper circuit layers 55 and one lower circuit layer 54 formed of a metal, a metal alloy, or other conductive material) in contact with the dielectric layer(s) 50 and at least one inner conductive via 56 (including, for example, a plurality of inner conductive vias 56). In some embodiments, the lower conductive structure 5 may be a coreless substrate. The lower conductive structure 5 may be also referred to as "a substrate structure", "a lower stacked structure", "a low-density conductive structure", "a low-density stacked structure", or "a second conductive traces structure". The circuit layers 55, 54 of the lower conductive structure 5 may be also referred to as "a low-density circuit layer". As shown in FIG. 1, the lower conductive structure 5 has a top surface 51, a bottom surface 52 opposite to the top surface 51, and a lateral surface 53 extending between the top surface 51 and the bottom surface 52. The lateral surface 23 of the upper conductive structure 2 may be displaced or recessed from the lateral surface 53 of the lower conductive structure 5. In some embodiments, the lateral surface 23 of the upper conductive structure 2 may be substantially coplanar with the lateral surface 53 of the lower conductive structure 5. The lower conductive structure 5 is apart from the upper conductive structure 2 by a distance D.

The lower circuit layer 54 is embedded in the bottommost dielectric layer 50, and exposed from the bottom surface of the bottommost dielectric layer 50 (e.g., the bottom surface 52 of the lower conductive structure 5). The upper circuit layers 55 are disposed on the dielectric layers 50. Some of the inner conductive vias 56 are disposed between two adjacent upper circuit layers 55 for electrically connecting the two upper circuit layers 55. The inner conductive vias 56 and the upper circuit layer 55 may be formed integrally and concurrently. Some of the inner conductive vias 56 are disposed between the upper circuit layer 55 and the lower circuit layer 54 for electrically connecting the upper circuit layer 55 and the lower circuit layer 54. Each inner conductive via 56 tapers downwardly along a direction from the top surface 51 towards the bottom surface 52 of the lower conductive structure 5. Thus, a tapering direction of the inner conductive via 56 of the lower conductive structure 5 is different from the tapering direction of the inner conductive via 25 of the upper conductive structure 2.

A thickness of each of the dielectric layers 20, 26, 27 of the upper conductive structure 2 is less than or equal to about 40%, less than or equal to about 35%, or less than or equal to about 30% of a thickness of each of the dielectric layers 50 of the lower conductive structure 5. In addition, a material of the dielectric layers 50 of the lower conductive structure 5 may be different from the material of the dielectric layers 20, 26, 27 of the upper conductive structure 2. For example, the material of the dielectric layers 50 of the lower conductive structure 5 may be polypropylene (PP) or ajinomoto build-up film (ABF).

An L/S of the upper circuit layer 55 and the lower circuit layer 54 may be greater than or equal to about 10 µm/about 10 µm. Thus, the L/S of the upper circuit layer 55 and the lower circuit layer 54 may be greater than or equal to about three times, or five times the L/S of the circuit layers 24 of the upper conductive structure 2. In addition, in some embodiments, the topmost upper circuit layer 55 may be covered by the topmost dielectric layer 50.

The intermediate layer 12 is interposed or disposed between the upper conductive structure 2 and the lower conductive structure 5 to bond the upper conductive structure 2 and the lower conductive structure 5 together. That is, the intermediate layer 12 adheres to the bottom surface 22 of the upper conductive structure 2 and the top surface 51 of the lower conductive structure 5. In some embodiments, the intermediate layer 12 may be an adhesion layer that is cured from an adhesive material (e.g., includes a cured adhesive material such as an adhesive polymeric material). Thus, the intermediate layer 12 contacts the bottommost dielectric layer (i.e., the third dielectric layer 27) of the upper conductive structure 2 and the topmost dielectric layer 55 of the lower conductive structure 5.

In some embodiments, a material of the intermediate layer 12 is transparent, and can be seen through by human eyes or machine. That is, a mark disposed adjacent to the top surface 51 of the lower conductive structure 5 can be recognized or detected from the top surface 21 of the upper conductive structure 2 by human eyes or machine. In addition, the material of intermediate layer 12 may be different from the material of the dielectric layers 50 the lower conductive structure 5 and the material of the dielectric layers 20, 26, 27 of the upper conductive structure 2. For example, the material of the intermediate layer 12 may be ABF, or ABF-like dielectric film. In some embodiments, the dielectric layers 20, 26, 27 of the upper conductive structure 2 and the intermediate layer 12 may be jointly referred to as "a dielectric structure 19".

The electrical connection structure 9 may extend through the upper conductive structure 2 and electrically connected to the lower conductive structure 5. The electrical connection structure 9 may have a length L. The electrical connection structure 9 may include a shoulder portion 92. For example, the electrical connection structure 9 may include a conductive via 14 and an interconnection structure 7. Thus, the electrical connection structure 9 may be divided into the conductive via 14 and the interconnection structure 7 by the shoulder portion 92. The conductive via 14 is farther from the lower conductive structure 5 than the interconnection structure 7 is, and the conductive via 14 tapers toward the interconnection structure 7. In some embodiments, the shoulder portion 92 may be defined by a lateral surface of the conductive via 14, a top surface 741 of the interconnection structure 7 and a lateral surface of the interconnection structure 7. The shoulder portion 92 is closer to the upper conductive structure 2 than the lower conductive structure 5 is. The shoulder portion 92 is located in the intermediate layer 12, and is located outside the upper conductive structure 2 and the lower conductive structure 5.

The upper conductive structure 2 and the intermediate layer 12 may define an accommodating hole 16 for accommodating the conductive via 14. In some embodiments, the accommodating hole 16 may extend through the upper conductive structure 2, may extend into the intermediate layer 12 and stopped by or terminated at a top surface 741 of the conductive material 74 of the interconnection structure 7. For example, the upper conductive structure 2 may define a through hole 161 extending through the upper conductive structure 2. The intermediate layer 12 may define an opening 124 communicated with the through hole 161 and stopped by or terminated at the top surface 741 of the conductive material 74 of the interconnection structure 7. The through hole 161 and the opening 124 form the accommodating hole 16. A cross section of a sidewall of the through hole 161 of the upper conductive structure 2 may be a continuous straight line, and a cross section of a sidewall of the opening 124 of the intermediate layer 12 may be curved.

The conductive via 14 is disposed in the accommodating hole 16, thus, the conductive via 14 may disposed in the upper conductive structure 2 and extend through the upper conductive structure 2, may extend into the intermediate layer 12 and may be stopped by or terminated at the top surface 741 of the conductive material 74 of the interconnection structure 7. The conductive via 14 is closer to the upper conductive structure 2 than the interconnection structure 7 is. The conductive via 14 may be a monolithic or one-piece structure. A cross section of a lateral surface of the conductive via 14 in the through hole 161 may be a continuous straight line, and a cross section of a lateral surface of the conductive via 14 may be curved. The conductive via 14 may include a seed layer 143 and a conductive material 144 (e.g., a plating metallic material) disposed on the seed layer 143. The seed layer 143 may be around or may surround the conductive material 144. In some embodiments, the seed layer 143 may be omitted. In some embodiments, the conductive material 144 of the conductive via 14 may be different from the conductive material 244 of the circuit layer 24. For example, the conductive material 144 of the conductive via 14 may include copper-iron composite, and the conductive material 244 of the circuit layer 24 may include copper sulfate. In addition, a lattice of the conductive material 144 of the conductive via 14 may be different form a lattice of the conductive material 244 of the circuit layer 24. A grain size of the conductive material 144 of the conductive via 14 may be greater than a grain size of the conductive material 244 of the circuit layer 24.

In some embodiments, the conductive via 14 may have a first length $L_1$. In addition, a width (e.g., a maximum width W) of a top surface of the conductive via 14 may be less than or equal to 20 μm, less than or equal to 15 μm, less than or equal to 10 μm, less than or equal to 8 μm, or less than or equal to 5 μm. In some embodiments, a ratio of the first length $L_1$ of the conductive via 14 to the maximum width W of the conductive via 14 may be less than 1.3:1 or 1:1. Thus, the shape of conductive via 14 may be substantially flat so as to reduce the difficult of manufacturing. However, in other embodiments, the ratio of the first length $L_1$ of the conductive via 14 to the maximum width W of the conductive via 14 may be greater than 1:1, 1.3:1, 1.5:1, or 2:1. A ratio of the length L of the electrical connection structure 9 to the maximum width W of the conductive via 14 may be greater than 1:1, 1.3:1, 1.5:1, 2:1, or 3:1. In some embodiments, a sum of the distance D and the first length $L_1$ of the conductive via 14 may be greater than the maximum width W of the conductive via 14. Further, the conductive via 14 tapers downwardly along a direction from the top surface 21 towards the bottom surface 22 of the upper conductive structure 2. Thus, the tapering direction of the conductive via 14 is different from a tapering direction of the inner conductive via 25.

In some embodiments, the conductive via 14 extends through at least two or the plurality of dielectric layers 20, 26, 27 of the upper conductive structure 2. A lateral surface of the portion of the conductive via 14 extending across at least two of the dielectric layers 20, 26, 27 is a continuous or smooth surface. The seed layer 143 of the conductive via 14 has a continuous lateral surface extending across at least two of the dielectric layers 20, 26, 27 of the upper conductive structure 2. The conductive via 14 may extend through the upper conductive structure 2. Thus, the conductive via 14 may extend beyond the bottom surface 22 of the upper conductive structure 2. In some embodiments, a first length $L_1$ of the conductive via 14 is greater than a thickness of the upper conductive structure 2, and is less than a sum of the thickness of the upper conductive structure 2 and a thickness T of the intermediate layer 12.

The interconnection structure 7 is disposed in the intermediate layer 12 and disposed outside the upper conductive structure 2. The conductive via 14 is stacked on and connected to the interconnection structure 7. Thus, the upper conductive structure 2 may be electrically connected to the lower conductive structure 5 through the interconnection structure 7 and the conductive via 14. There is a boundary surface between the conductive via 14 and the interconnection structure 7. The boundary surface between the interconnection structure 7 and the conductive via 14 may include a recessed surface that is recessed toward the lower conductive structure 5. The interconnection structure 7 may be a monolithic or one-piece structure. The interconnection structure 7 may include a seed layer 73 and a conductive material 74 (e.g., a plating metallic material) disposed on the seed layer 73. In some embodiments, the seed layer 73 may be disposed in an opening 503 of the topmost dielectric layer 50 of the lower conductive structure 5, and may not cover the lateral surface of the conductive material 74. In some embodiments, the interconnection structure 7 may include a main portion 76 and a bottom portion 77. The main portion 76 protrudes from the top surface 51 of the lower conductive structure 5, and the bottom portion 77 is disposed on the seed layer 73 in the opening 503.

In some embodiments, an organization structure of the conductive material 74 of the interconnection structure 7 is different from an organization structure of a material of the circuit layer 55 of the lower conductive structure 5. A metallographic structure of the conductive material 74 of the interconnection structure 7 is different from a metallographic structure of the material of the circuit layer 55 of the lower conductive structure 5. Thus, the interconnection structure 7 and the lower conductive structure 5 are metallographically distinct. In addition, a lattice of the conductive material 74 of the interconnection structure 7 may be different form a lattice of the material of the circuit layer 55 of the lower conductive structure 5. For example, the organization structure (e.g., a metallographic structure) of the conductive material 74 of the interconnection structure 7 is different from an organization structure (e.g., a metallographic structure) of a material of a pad 551 of the circuit layer 55 of the lower conductive structure 5. In some embodiments, the material of the conductive material 74 of the interconnection structure 7 includes electroplated copper, and the material of the circuit layer 55 of the lower conductive structure 5 includes rolled copper.

The interconnection structure 7 is disposed on the pad 551 of the outermost circuit layer 55 of the lower conductive structure 5. The conductive via 14 and the upper conductive structure 2 is disposed adjacent to a first side (e.g., a top side) of the interconnection structure 7, and the lower conductive structure 5 is disposed adjacent to second side (e.g., a bottom side) of the interconnection structure 7. The first side (e.g., a top side) of the interconnection structure 7 is opposite to the second side (e.g., a bottom side) of the interconnection structure 7. A structure of the interconnection structure 7 includes a monolithic pillar, and tapers downwardly along a direction from the intermediate layer 12 toward the lower conductive structure 5. Thus, the tapering direction of the conductive via 14 is same as a tapering direction of the interconnection structure 7. In some embodiments, a second length L2 of the interconnection structure 7 is less than the thickness T of the intermediate layer 12. The intermediate layer 12 may cover a portion of the top surface 741 of the conductive material 74 (i.e., the top surface of the main portion 76) of the interconnection structure 7. Thus, a portion of the intermediate layer 12 may be disposed in the gap 17 or space between the top surface 741 of the conductive material 74 of the interconnection structure 7 and the bottom surface 22 of the upper conductive structure 2. The conductive via 14 may extend into the intermediate layer 12 and may be stopped by or terminated at the top surface 741 of the conductive material 74 of the interconnection structure 7. Thus, the conductive via 14 may contact the top surface 741 of the conductive material 74 of the interconnection structure 7. In some embodiments, the upper conductive structure 2 is electrically connected to the lower conductive structure 5 only through the combination of the conductive via 14 and the interconnection structure 7. In some embodiments, the top surface 741 of the conductive material 74 of the interconnection structure 7 may include a recessed surface.

As shown in the embodiment illustrated in FIG. 1 and FIG. 2, the circuit structure 1 is a combination of the upper conductive structure 2 and the lower conductive structure 5, in which the circuit layers 24 of the upper conductive structure 2 has fine pitch, high yield and low thickness; and the upper circuit layers 55 of the lower conductive structure 5 have low manufacturing cost. Thus, the circuit structure 1 has an advantageous compromise of yield and manufacturing cost, and the circuit structure 1 has a relatively low thickness. The manufacturing yield for one layer of the circuit layers 24 of the upper conductive structure 2 may be 99%, and the manufacturing yield for one layer of the upper circuit layers 55 of the lower conductive structure 5 may be 90%. Thus, the yield of the circuit structure 1 may be improved.

In addition, the interconnection structure 7 is interposed between the conductive via 14 and the pad 551 of the circuit layer 55 of the lower conductive structure 5. Thus, the first length $L_1$ of the conductive via 14 may be shortened, the maximum width W of the top surface of the conductive via 14 may be reduced to be less than or equal to 20 μm, and the ratio of the first length $L_1$ of the conductive via 14 to the maximum width W of the conductive via 14 may be greater than 1:1, 1.3:1, 1.5:1, or 2:1.

In a comparative embodiment, the interconnection structure 7 is omitted, and the conductive via 14 needs to extend through both the upper conductive structure 2 and the intermediate layer 12. Thus, the accommodating hole 16 may have a relatively large length, and the bottom portion of the accommodating hole 16 may have a relatively small size (e.g., a small width) if the size (e.g., a width) of the top portion of the accommodating hole 16 is fixed. For example, a ratio of a depth of the accommodating hole 16 to a maximum width of the accommodating hole 16 (i.e., a width of an opening of the accommodating hole 16) may be greater than 1.3:1. During the electroplating of the conductive via 14, void may occur at the small-sized bottom portion of the accommodating hole 16, which may adversely affect the quality of the electroplating and may reduce the yield rate of the conductive via 14. In a worst case, the plating solution may not reach to the bottom portion of the accommodating hole 16, and the seed layer 143 and the conductive material 144 of the conductive via 14 may not be plated on the bottom portion of the accommodating hole 16.

Figure 3:
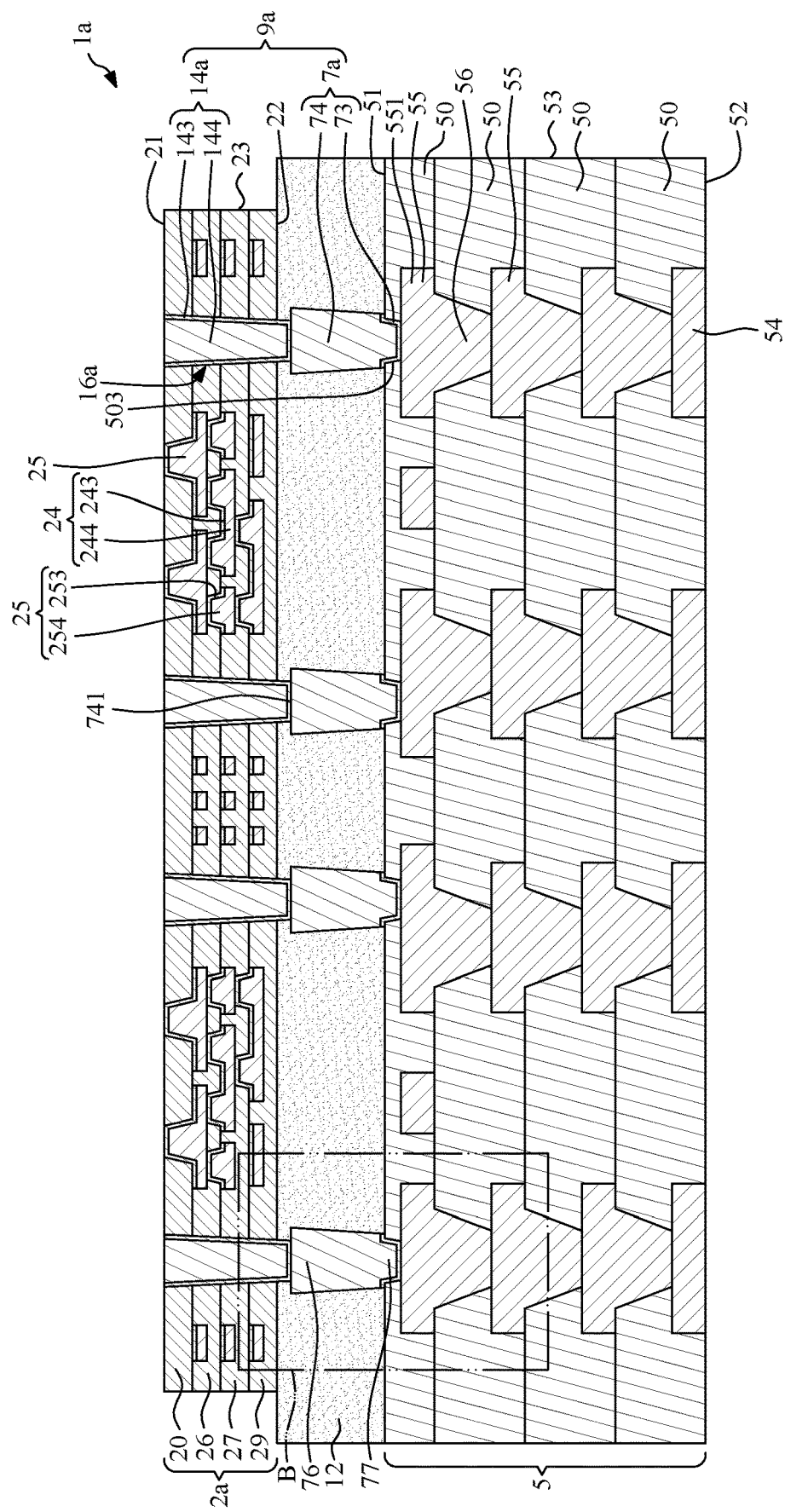
FIG. 3 illustrates a cross-sectional view of a circuit structure according to some embodiments of the present disclosure.
Figure 4:
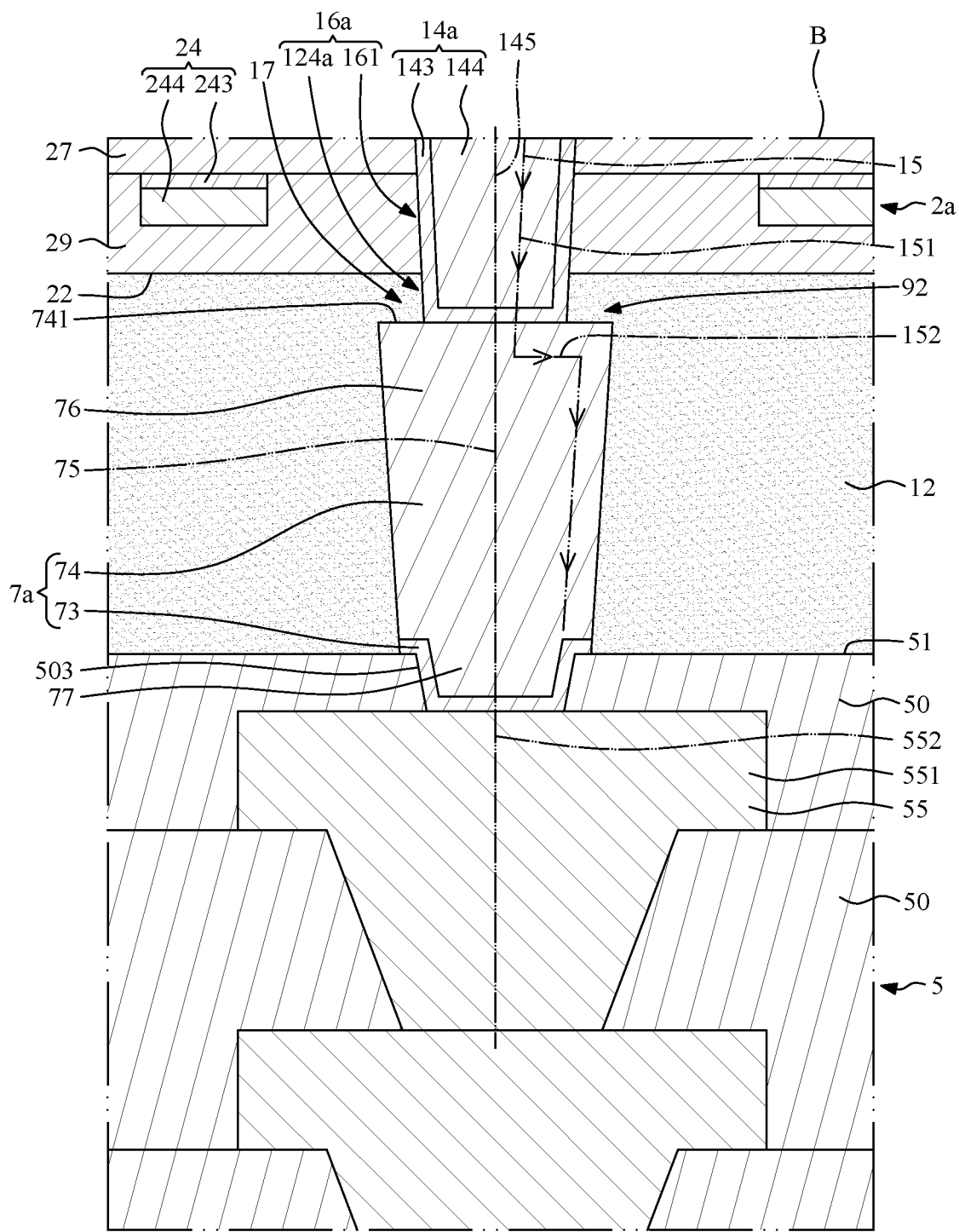
FIG. 4 illustrates a partially enlarged view of a region "B" in FIG. 3.

FIG. 3 illustrates a cross-sectional view of a circuit structure 1a according to some embodiments of the present disclosure. FIG. 4 illustrates a partially enlarged view of a region "B" in FIG. 3. The circuit structure 1a is similar to the circuit structure 1 shown in FIG. 1 and FIG. 2, except that the upper conductive structure 2a further includes a circuit layer 24 and a fourth dielectric layer 29 covering the third dielectric layer 27. In addition, the electrical connection structure 9a may include the conductive via 14a and the interconnection structure 7a. The top surface 741 of the conductive material 74 of the interconnection structure 7a may be a flat surface. A cross section of the sidewall of the opening 124a of the intermediate layer 12 is a substantially straight line. Thus, a cross section of the sidewall of the entire accommodating hole 16a of the upper conductive structure 2a is a substantially straight line, and a cross section of the lateral surface of the entire conductive via 14a is a substantially straight line.

Referring to FIG. 4, an electrical path 15 between the upper conductive structure 2 and the lower conductive structure 5 includes a first path 151 and a second path 152 non-parallel with the first path 151. The second path 152 is substantially parallel with the top surface 741 of the conductive material 74 of the interconnection structure 7a or the top surface 51 of the lower conductive structure 5. In some embodiments, the electrical path 15 may include the interconnection structure 7a and the conductive via 14a. A central axis 75 of the interconnection structure 7a is aligned with a central axis 552 of the pad 551 of the circuit layer 55 of the lower conductive structure 5 and a central axis 145 of the conductive via 14a. A projection of the interconnection structure 7a on the top surface 51 of the lower conductive structure 5 is within an area of the pad 551 of the circuit layer 55 of the lower conductive structure 5.

Figure 5:
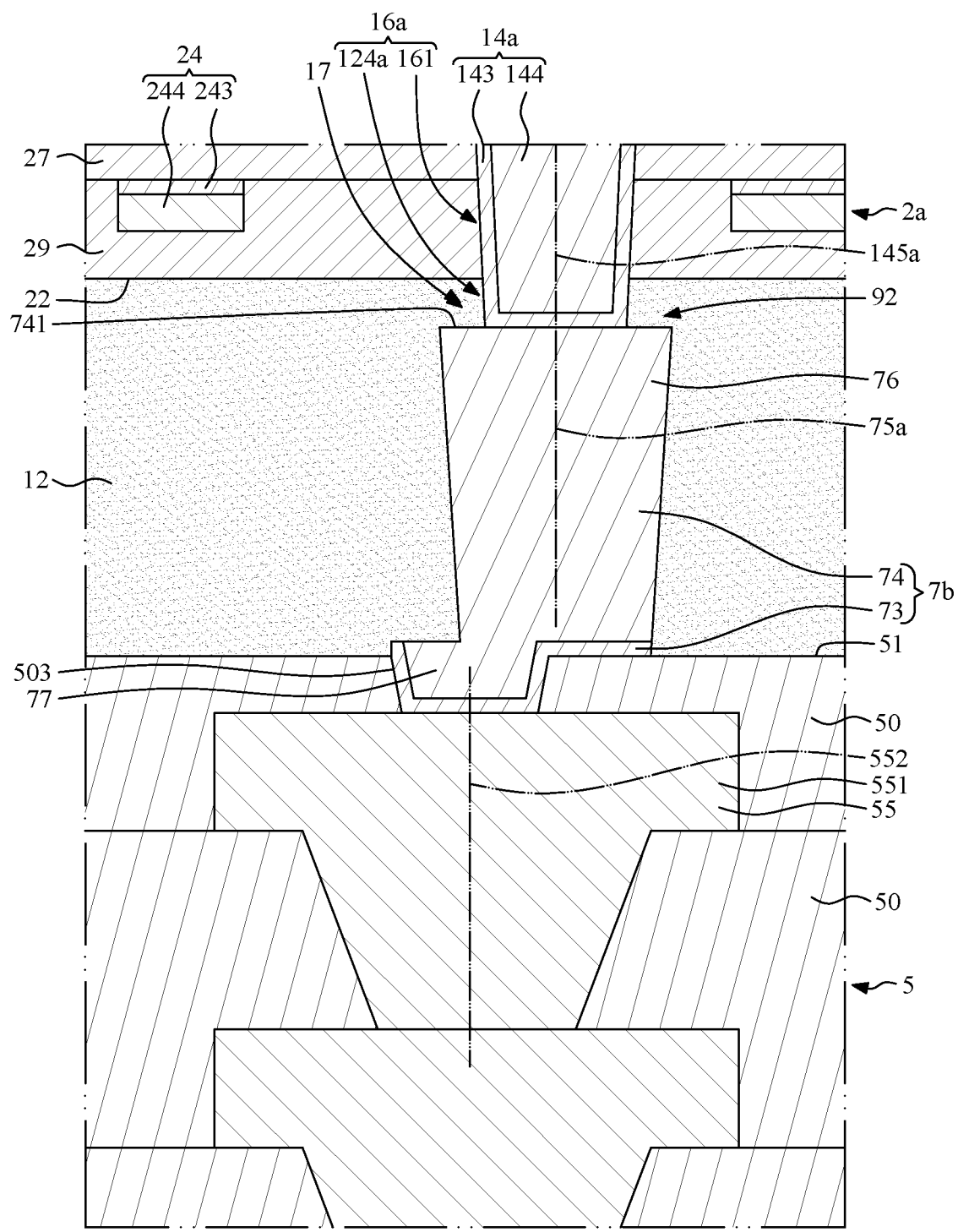
FIG. 5 illustrates a partially enlarged cross-sectional view of a circuit structure according to some embodiments of the present disclosure.

FIG. 5 illustrates a partially enlarged cross-sectional view of a circuit structure according to some embodiments of the present disclosure. The structure shown in FIG. 5 is similar to the structure shown in FIG. 4, except for a structure of the interconnection structure 7b. As shown in FIG. 5, the central axis 75a of the main portion 76 of the interconnection structure 7b is shifted from the central axis 552 of the pad 551 of the circuit layer 55 of the lower conductive structure 5. Thus, the main portion 76 of the interconnection structure 7b is shifted from the bottom portion 77 of the interconnection structure 7b. The central axis 75a of the main portion 76 of interconnection structure 7b is aligned with the central axis 145a of the conductive via 14a. Thus, the central axis 145a of the conductive via 14a is shifted from the central axis 552 of the pad 551 of the circuit layer 55 of the lower conductive structure 5. In addition, a projection of the main portion 76 of the interconnection structure 7b on the top surface 51 of the lower conductive structure 5 overlaps a portion a projection of the bottom portion 77 of the interconnection structure 7b on the top surface 51 of the lower conductive structure 5. A projection of the conductive via 14a on the top surface 51 of the lower conductive structure 5 overlaps a portion a projection of the bottom portion 77 of the interconnection structure 7b on the top surface 51 of the lower conductive structure 5. In some embodiments, the projection of the main portion 76 of the interconnection structure 7b on the top surface 51 of the lower conductive structure 5 may overlap a portion of the area of the pad 551 of the circuit layer 55 of the lower conductive structure 5.

Figure 6:
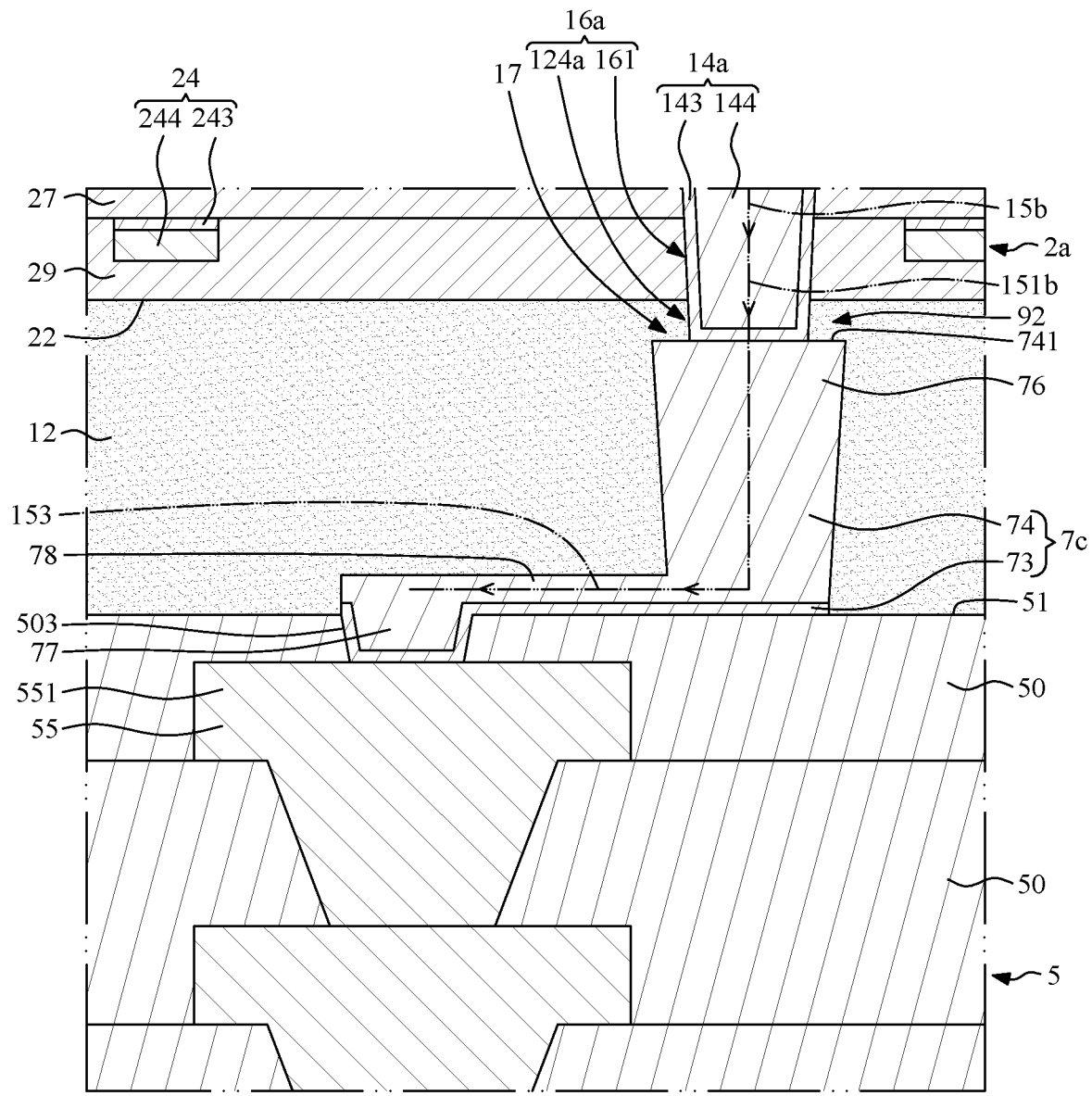
FIG. 6 illustrates a partially enlarged cross-sectional view of a circuit structure according to some embodiments of the present disclosure.

FIG. 6 illustrates a partially enlarged cross-sectional view of a circuit structure according to some embodiments of the present disclosure. The structure shown in FIG. 6 is similar to the structure shown in FIG. 5, except for a structure of the interconnection structure 7c. As shown in FIG. 6, the projection of the main portion 76 of the interconnection structure 7c on the top surface 51 of the lower conductive structure 5 is outside the area of the pad 551 of the circuit layer 55 of the lower conductive structure 5. The projection of the conductive via 14a on the top surface 51 of the lower conductive structure 5 is outside the area of the pad 551 of the circuit layer 55 of the lower conductive structure 5. The interconnection structure 7c may include the main portion 76, the bottom portion 77 and a connecting portion 78 extending between the main portion 76 and the bottom portion 77. In addition, the electrical path 15b between the upper conductive structure 2a and the lower conductive structure 5 includes a first path 151b and a second path 153 non-parallel with the first path 151b. The second path 153 is located in the connecting portion 78 of the interconnection structure 7c, and is parallel with the top surface 51 of the lower conductive structure 5.

Figure 7:
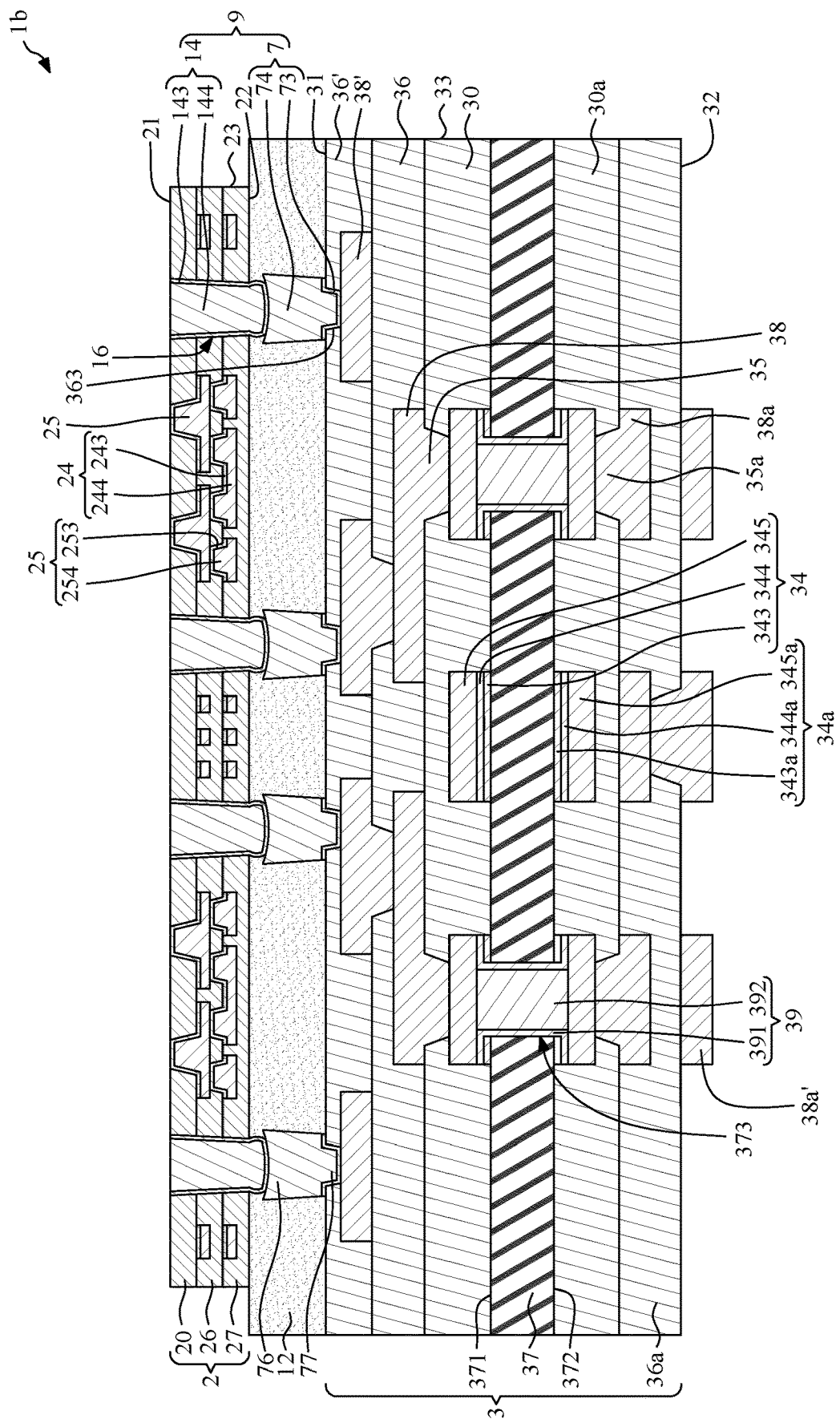
FIG. 7 illustrates a cross-sectional view of a circuit structure according to some embodiments of the present disclosure.

FIG. 7 illustrates a cross-sectional view of a circuit structure 1b according to some embodiments of the present disclosure. The circuit structure 1a of FIG. 7 is similar to the circuit structure 1 shown in FIG. 1, except that the lower conductive structure 5 of FIG. 1 is replaced by the lower conductive structure 3 of FIG. 7. As shown in FIG. 7, the lower conductive structure 3 includes at least one dielectric layer (including, for example, one first upper dielectric layer 30, one second upper dielectric layer 36, one top dielectric layer 36', one first lower dielectric layer 30a and one second lower dielectric layer 36a) and at least one circuit layer (including, for example, one first upper circuit layer 34, two second upper circuit layers 38, 38', one first lower circuit layer 34a and two second lower circuit layers 38a, 38a' formed of a metal, a metal alloy, or other conductive material) in contact with the dielectric layer (e.g., the first upper dielectric layer 30, the second upper dielectric layer 36, the top dielectric layer 36', the first lower dielectric layer 30a and the second lower dielectric layer 36a). In some embodiments, the lower conductive structure 3 may be similar to a core substrate that further includes a core portion 37. The core portion 37 may be an organic substrate. The lower conductive structure 3 may be also referred to as "a substrate structure", "a lower stacked structure" or "a low-density conductive structure" or "a low-density stacked structure". The circuit layer (including, for example, the first upper circuit layer 34, the two second upper circuit layers 38, 38', the first lower circuit layer 34a and the two second lower circuit layers 38a, 38a') of the lower conductive structure 3 may be also referred to as "a low-density circuit layer". As shown in FIG. 7, the lower conductive structure 3 has a top surface 31, a bottom surface 32 opposite to the top surface 31, and a lateral surface 33 extending between the top surface 31 and the bottom surface 32. The lower conductive structure 3 may include a plurality of dielectric layers (for example, the first upper dielectric layer 30, the second upper dielectric layer 36, the top dielectric layer 36', the first lower dielectric layer 30a and the second lower dielectric layer 36a), a plurality of circuit layers (for example, the first upper circuit layer 34, the two second upper circuit layers 38, 38', the first lower circuit layer 34a and the two second lower circuit layers 38a, 38a') and at least one inner conductive via (including, for example, a plurality of upper interconnection vias 35 and a plurality of lower interconnection vias 35a). As shown in FIG. 7, the lateral surface 23 of the upper conductive structure 2 may be displaced or recessed from the lateral surface 33 of the lower conductive structure 3.

The core portion 37 has a top surface 371 and a bottom surface 372 opposite to the top surface 371, and defines a plurality of first through holes 373 extending through the core portion 37. An interconnection via 39 is disposed or formed in each first through hole 373 for vertical connection. In some embodiments, the interconnection via 39 includes a base metallic layer 391 and an insulation material 392. The base metallic layer 391 is disposed or formed on a side wall of the first through hole 373, and defines a central through hole. The insulation material 392 fills the central through hole defined by the base metallic layer 391. In some embodiments, the interconnection via 39 may omit an insulation material, and may include a bulk metallic material that fills the first through hole 373.

The first upper dielectric layer 30 is disposed on the top surface 371 of the core portion 37. The second upper dielectric layer 36 is stacked or disposed on the first upper dielectric layer 30. The top dielectric layer 36' is stacked or disposed on the second upper dielectric layer 36. In addition, the first lower dielectric layer 30a is disposed on the bottom surface 372 of the core portion 37. The second lower dielectric layer 36a is stacked or disposed on the first lower dielectric layer 30a.

A thickness of each of the dielectric layers 20, 26, 27 of the upper conductive structure 2 is less than or equal to about 40%, less than or equal to about 35%, or less than or equal to about 30% of a thickness of each of the dielectric layers 30, 36, 36', 30a, 36a of the lower conductive structure 3. In addition, a material of the dielectric layers 30, 36, 36', 30a, 36a of the lower conductive structure 3 may be different from the material of the dielectric layers 20, 26, 27 of the upper conductive structure 2. For example, the material of the dielectric layers 30, 36, 36', 30a, 36a of the lower conductive structure 3 may be polypropylene (PP) or ajinomoto build-up film (ABF).

An L/S of the first upper circuit layer 34 may be greater than or equal to about 10 μm/about 10 μm. Thus, the L/S of the first upper circuit layer 34 may be greater than or equal to about five times the L/S of the circuit layers 24 of the upper conductive structure 2. In some embodiments, the first upper circuit layer 34 is formed or disposed on the top surface 371 of the core portion 37, and covered by the first upper dielectric layer 30. In some embodiments, the first upper circuit layer 34 may include a first metallic layer 343, a second metallic layer 344 and a third metallic layer 345. The first metallic layer 343 is disposed on the top surface 371 of the core portion 37, and may be formed from a copper foil (e.g., may constitute a portion of the copper foil). The second metallic layer 344 is disposed on the first metallic layer 343, and may be a plated copper layer. The third metallic layer 345 is disposed on the second metallic layer 344, and may be another plated copper layer. In some embodiments, the third metallic layer 345 may be omitted.

An L/S of the second upper circuit layer 38 may be greater than or equal to about 10 μm/about 10 μm. In some embodiments, the second upper circuit layer 38 is formed or disposed on the first upper dielectric layer 30, and covered by the second upper dielectric layer 36. In some embodiments, the second upper circuit layer 38 is electrically connected to the first upper circuit layer 34 through the upper interconnection vias 35. Each upper interconnection via 35 tapers downwardly along a direction from the top surface 31 towards the bottom surface 32 of the lower conductive structure 3.

In addition, in some embodiments, the second upper circuit layer 38' is disposed on the second upper dielectric layer 36, and covered by the top dielectric layer 36'. In some embodiments, the second upper circuit layer 38 is electrically connected to the second upper circuit layer 38' through the upper interconnection vias 35. In some embodiments, the top dielectric layer 36' defines at least one opening 363 to expose a portion of the second upper circuit layer 38'. The main portion 76 of the interconnection structure 7 protrudes from the top surface 31 of the lower conductive structure 3, and the bottom portion 77 of the interconnection structure 7 is disposed on the seed layer 73 in the opening 363 of the top dielectric layer 36'. Thus, the interconnection structure 7 is electrically connected to and contacts the second upper circuit layer 38' of the lower conductive structure 3.

An L/S of the first lower circuit layer 34a may be greater than or equal to about 10 μm/about 10 μm. In some embodiments, the first lower circuit layer 34a is formed or disposed on the bottom surface 372 of the core portion 37, and covered by the first lower dielectric layer 30a. In some embodiments, the first lower circuit layer 34a may include a first metallic layer 343a, a second metallic layer 344a and a third metallic layer 345a. The first metallic layer 343a is disposed on the bottom surface 372 of the core portion 37, and may be formed from a copper foil. The second metallic layer 344a is disposed on the first metallic layer 343a, and may be a plated copper layer. The third metallic layer 345a is disposed on the second metallic layer 344a, and may be another plated copper layer. In some embodiments, the third metallic layer 345a may be omitted.

An L/S of the second lower circuit layer 38a may be greater than or equal to about 10 μm/about 10 μm. In some embodiments, the second lower circuit layer 38a is formed or disposed on the first lower dielectric layer 30a, and covered by the second lower dielectric layer 36a. In some embodiments, the second lower circuit layer 38a is electrically connected to the first lower circuit layer 34a through the lower interconnection vias 35a. The lower interconnection via 35a tapers upwardly along a direction from the bottom surface 32 towards the top surface 31 of the lower conductive structure 3. In addition, in some embodiments, the second lower circuit layer 38a' is disposed on and protrudes from the bottom surface of the second lower dielectric layer 36a. In some embodiments, the second lower circuit layer 38a' is electrically connected to the second lower circuit layer 38a through the lower interconnection vias 35a.

In some embodiments, each interconnection via 39 electrically connects the first upper circuit layer 34 and the first lower circuit layer 34a. The base metallic layer 391 of the interconnection via 39, the second metallic layer 344 of the first upper circuit layer 34 and the second metallic layer 344a the first lower circuit layer 34a may be formed integrally and concurrently as a monolithic or one-piece structure.

Figure 8:
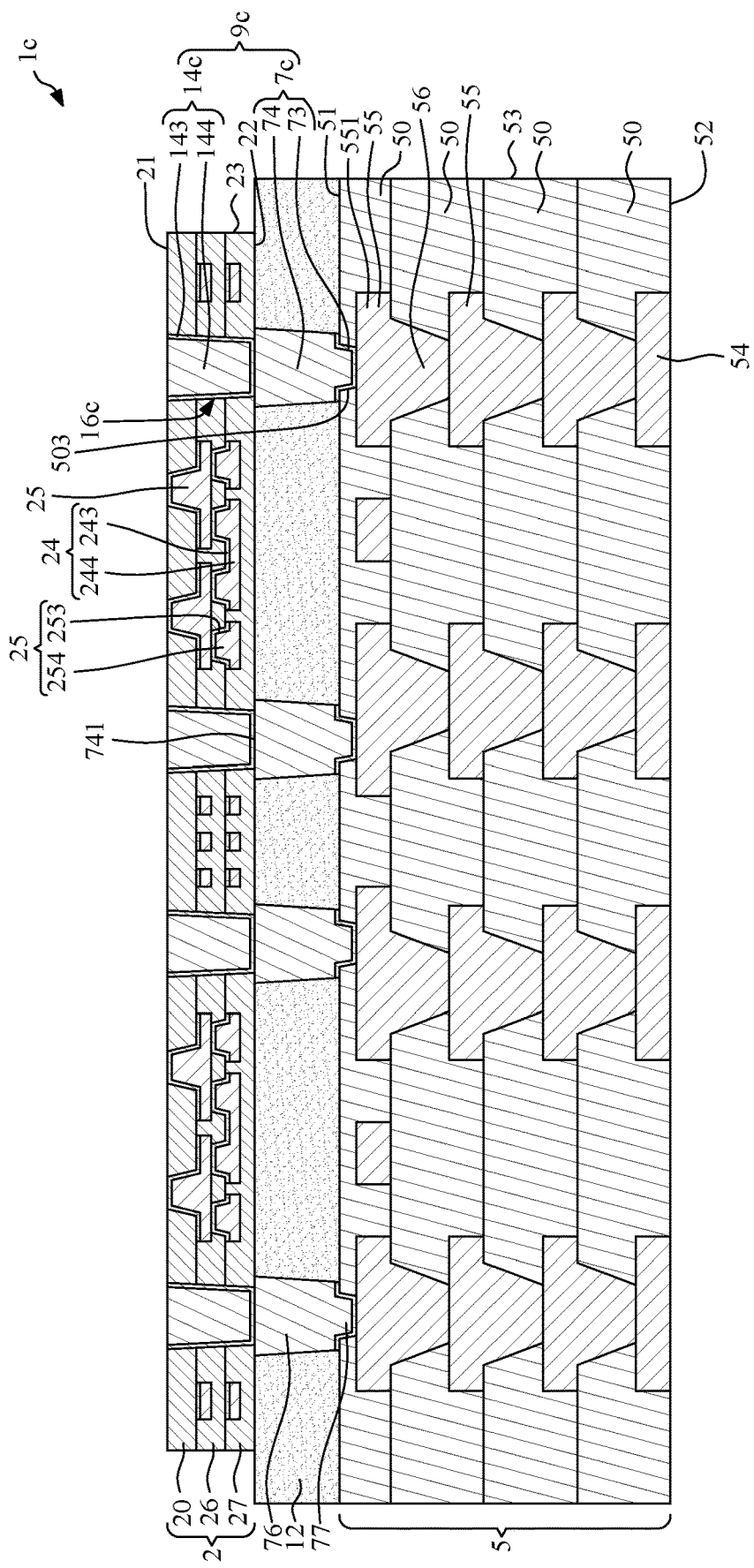
FIG. 8 illustrates a cross-sectional view of a circuit structure according to some embodiments of the present disclosure.

FIG. 8 illustrates a cross-sectional view of a circuit structure 1c according to some embodiments of the present disclosure. The circuit structure 1c is similar to the circuit structure 1 shown in FIG. 1, except for a structure of the electrical connection structure 9c. The electrical connection structure 9c may include the conductive via 14c and the interconnection structure 7c. The top surface 741 of the conductive material 74 of the interconnection structure 7c may be a flat surface and may be coplanar with the top surface of the intermediate layer 12 or the bottom surface 22 of the upper conductive structure 2. Thus, a cross section of the sidewall of the entire accommodating hole 16c of the upper conductive structure 2 is a substantially straight line, and a cross section of the lateral surface of the entire conductive via 14c is a substantially straight line.

Figure 9:
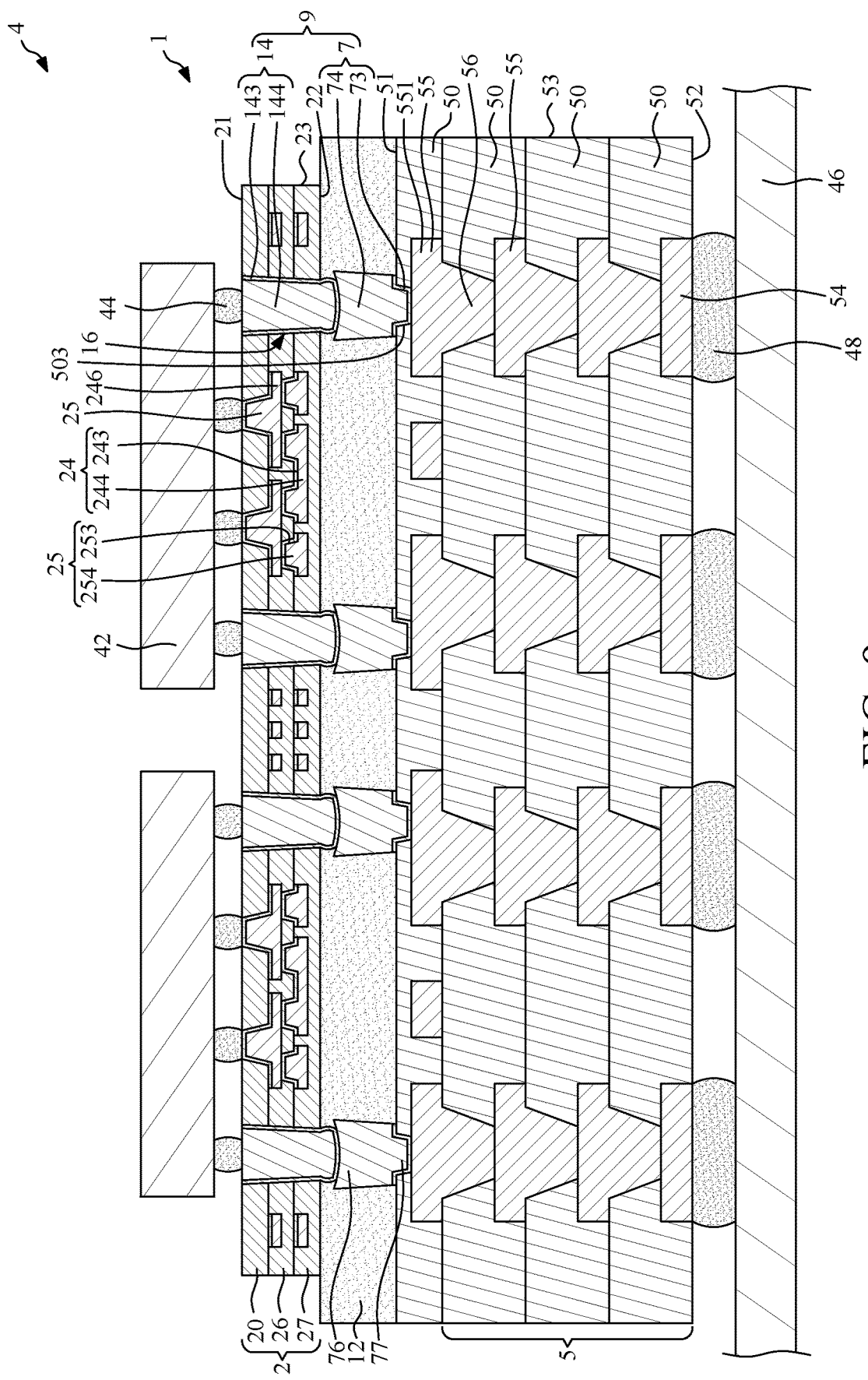
FIG. 9 illustrates a cross-sectional view of a bonding of a package structure and a substrate according to some embodiments of the present disclosure.

FIG. 9 illustrates a cross-sectional view of a bonding of a package structure 4 and a substrate 46 according to some embodiments of the present disclosure. The package structure 4 includes a circuit structure 1, an electronic device (e.g., a semiconductor chip) 42, a plurality of first connecting elements 44 and a plurality of second connecting elements 48. The package structure 4 may be also referred to as "an electronic structure". The circuit structure 1 of FIG. 9 is similar to the circuit structure 1 shown in FIG. 1. The electronic device 42 is disposed on the upper conductive structure 2. For example, the electronic device 42 is electrically connected and bonded to the conductive via(s) 14 and the exposed inner conductive via 25 of the upper conductive structure 2 through the first connecting elements 44 (e.g., solder bumps or other conductive bumps). The lower circuit layer 54 of the lower conductive structure 5 is electrically connected and bonded to the substrate 46 (e.g., a mother board such as a printed circuit board (PCB)) through the second connecting elements 48 (e.g., solder bumps or other conductive bumps).

FIG. 10 through FIG. 27 illustrate a method for manufacturing a circuit structure according to some embodiments of the present disclosure. In some embodiments, the method is for manufacturing the circuit structure 1 shown in FIG. 1.

Figure 10:
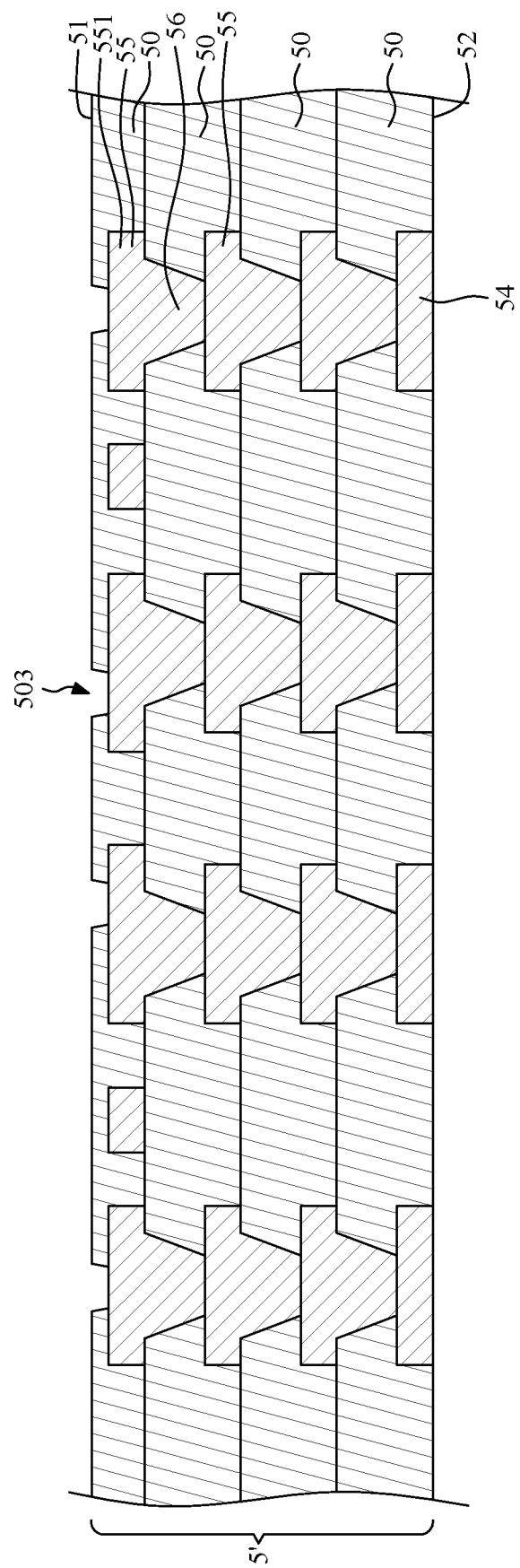
FIG. 10 illustrates one or more stages of an example of a method for manufacturing a circuit structure according to some embodiments of the present disclosure.

Referring to FIG. 10, a lower conductive structure 5' is provided. The lower conductive structure 5' is similar to the lower conductive structure 5 of FIG. 1, and includes the dielectric layers 50, the circuit layers 55, 54 and the inner conductive vias 56. The topmost dielectric layer 50 may define at least one opening 503 to expose the pad 551 of the topmost circuit layer 55.

Figure 11:
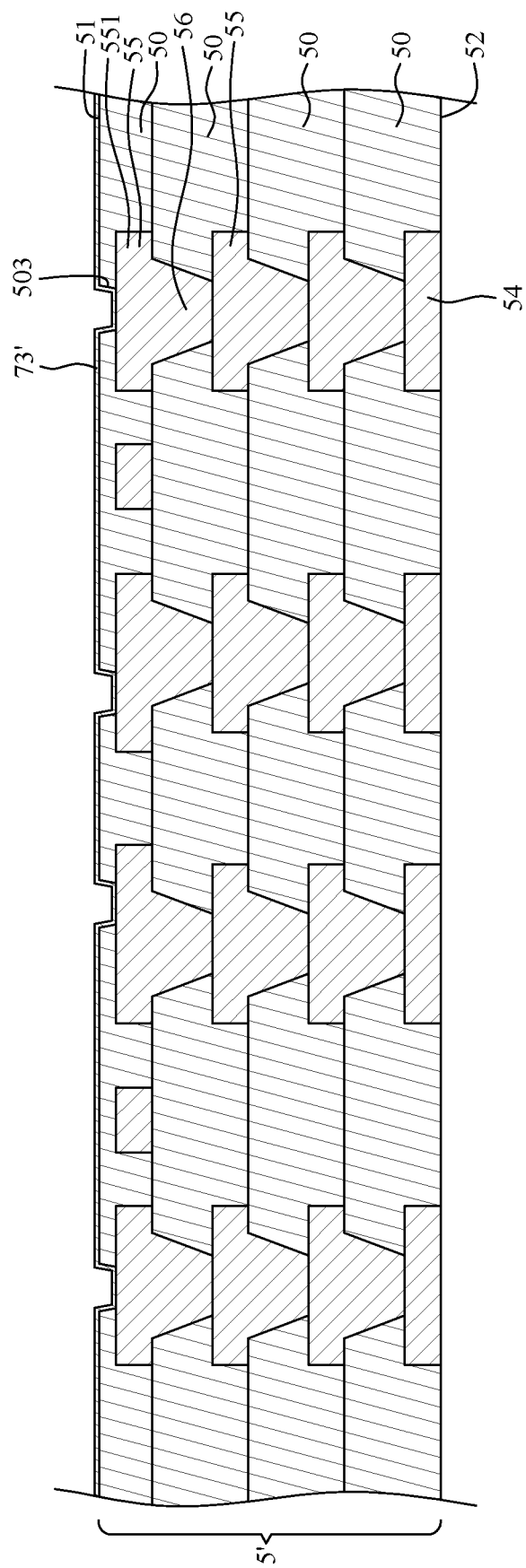
FIG. 11 illustrates one or more stages of an example of a method for manufacturing a circuit structure according to some embodiments of the present disclosure.

Referring to FIG. 11, a seed layer 73' is formed or disposed on the top surface 51 of the lower conductive structure 5', and in the opening 503 to contact the pad 551.

Figure 12:
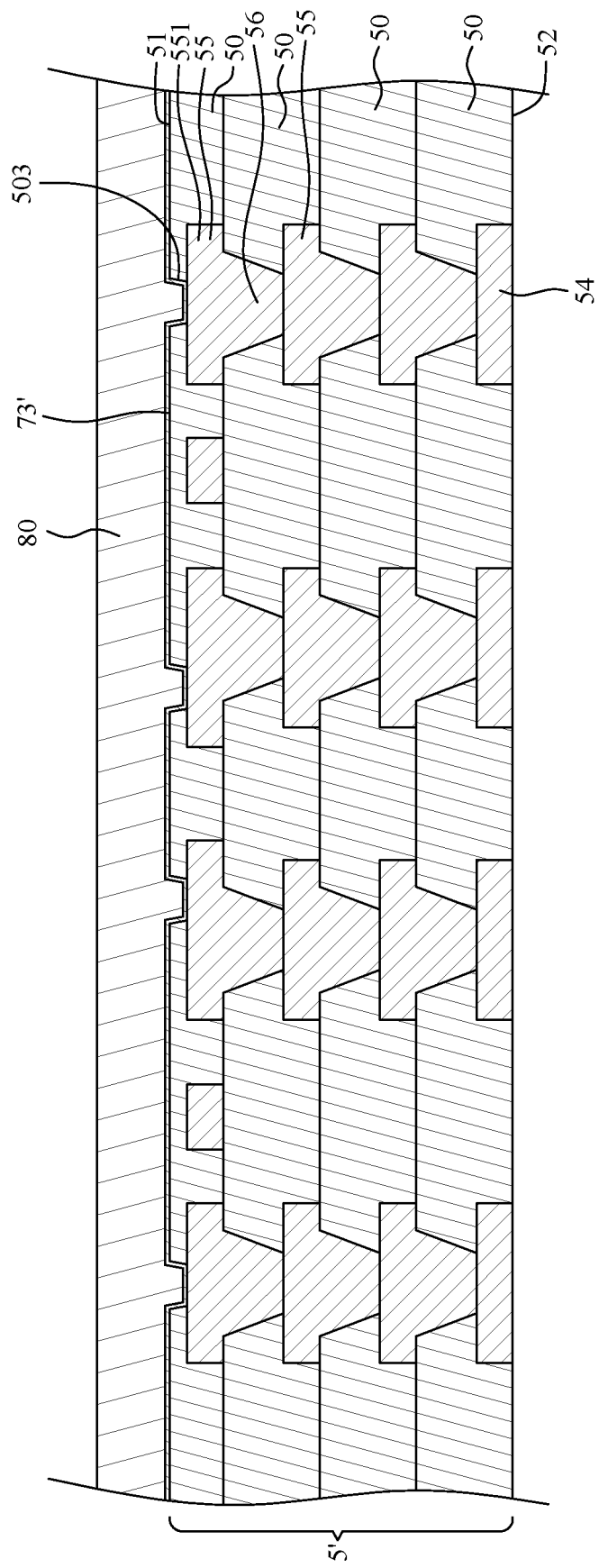
FIG. 12 illustrates one or more stages of an example of a method for manufacturing a circuit structure according to some embodiments of the present disclosure.

Referring to FIG. 12, a photoresist layer 80 is formed or disposed on the seed layer 73'.

Figure 13:
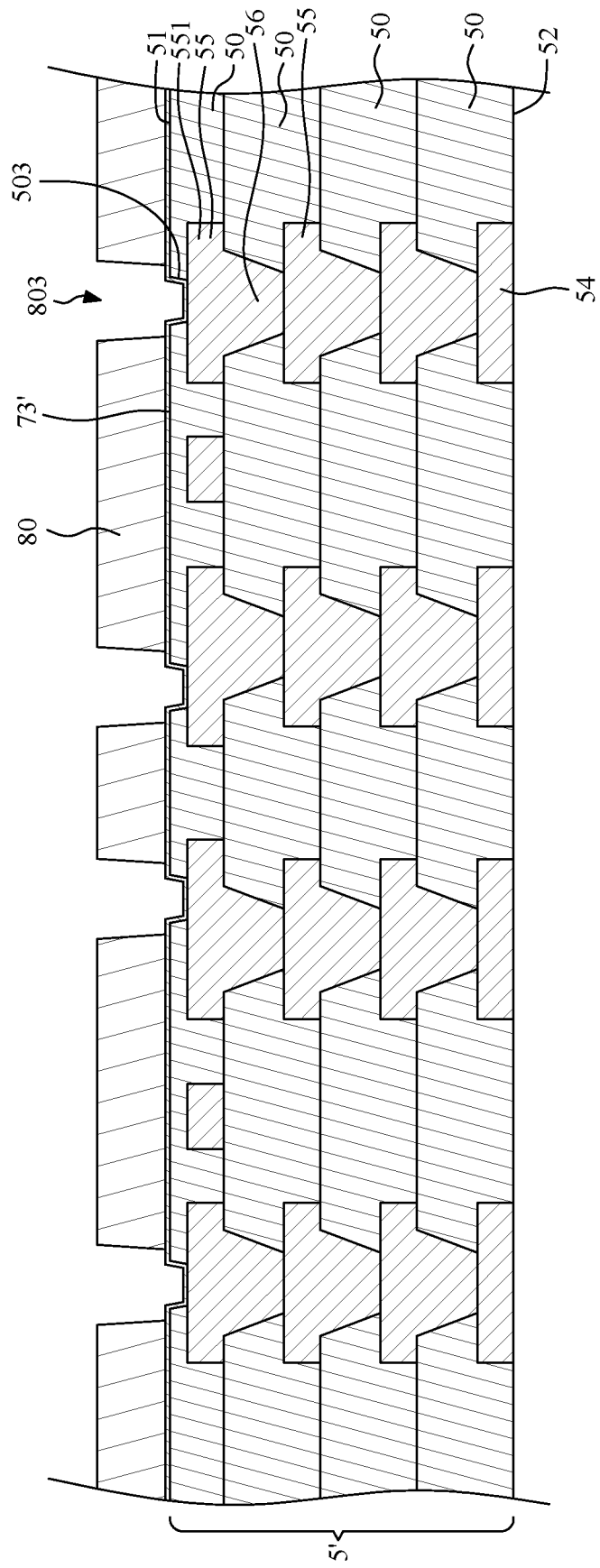
FIG. 13 illustrates one or more stages of an example of a method for manufacturing a circuit structure according to some embodiments of the present disclosure.

Referring to FIG. 13, at least one opening 803 is formed to extend through the photoresist layer 80. The opening 803 is disposed above the opening 503 of the topmost dielectric layer 50 to expose a portion of the seed layer 73' in the opening 503.

Figure 14:
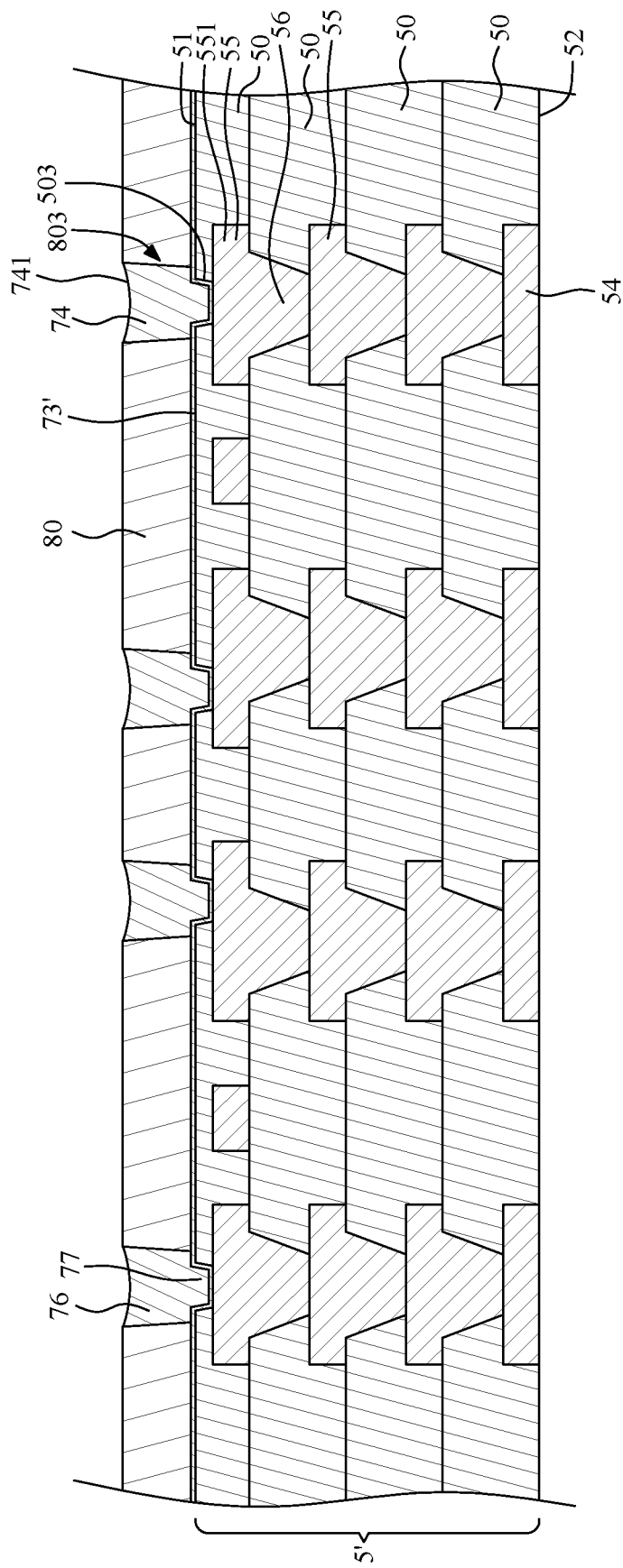
FIG. 14 illustrates one or more stages of an example of a method for manufacturing a circuit structure according to some embodiments of the present disclosure.

Referring to FIG. 14, a conductive material 74 (e.g., a plating metallic material) is formed or disposed in the opening 803 of the photoresist layer 80 and on the exposed portion of the seed layer 73' in the opening 503 by, for example, electroplating. The top surface 741 of the conductive material 74 may be a recessed surface.

Figure 15:
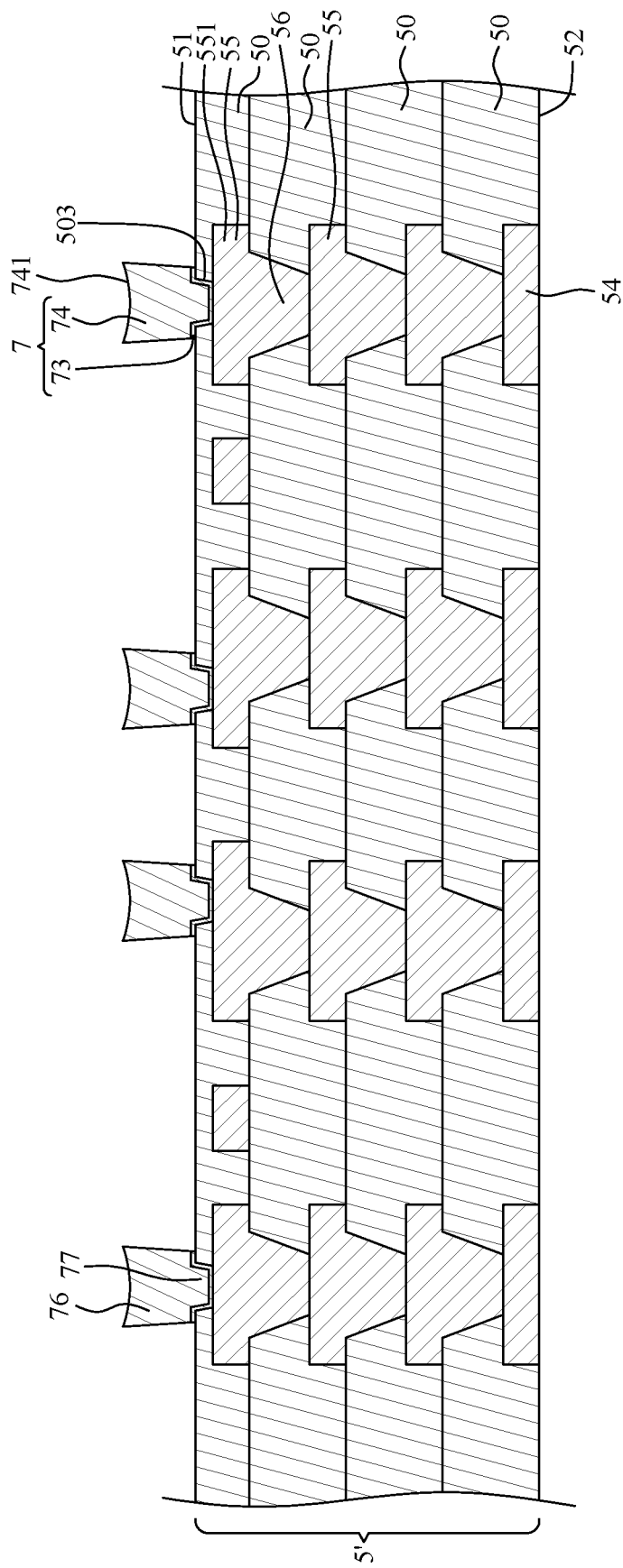
FIG. 15 illustrates one or more stages of an example of a method for manufacturing a circuit structure according to some embodiments of the present disclosure.

Referring to FIG. 15, the photoresist layer 80 is removed. Then, portions of the seed layer 73' that are not covered by the conductive material 74 is removed by, for example, etching. Thus, an interconnection structure 7 is formed on the top surface 51 of the lower conductive structure 5. The interconnection structure 7 may be a monolithic or one-piece structure. The interconnection structure 7 may include a seed layer 73 in the opening 503 and a conductive material 74 disposed on the seed layer 73.

Figure 16:
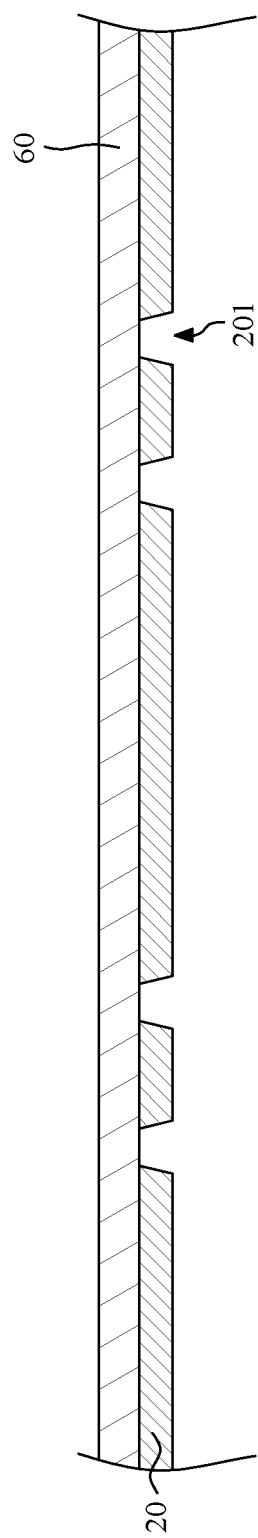
FIG. 16 illustrates one or more stages of an example of a method for manufacturing a circuit structure according to some embodiments of the present disclosure.

Referring to FIG. 16 through FIG. 22, an upper conductive structure 2 is provided. The upper conductive structure 2 is manufactured as follows. Referring to FIG. 16, a carrier 60 is provided. The carrier 60 may be a glass carrier, and may be in a wafer type, a panel type or a strip type. Then, a patterned first dielectric layer 20 is formed on the carrier 60. The patterned first dielectric layer 20 defines at least one first opening 201 extending through the first dielectric layer 20.

Figure 17:
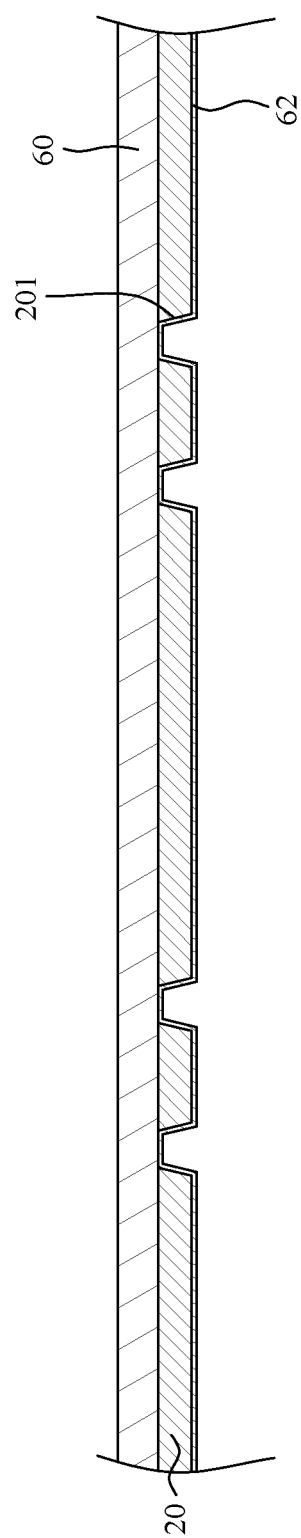
FIG. 17 illustrates one or more stages of an example of a method for manufacturing a circuit structure according to some embodiments of the present disclosure.

Referring to FIG. 17, a seed layer 62 is formed or disposed on the first dielectric layer 20 and in the first opening 201 by a physical vapor deposition (PVD) technique or other suitable techniques.

Figure 18:
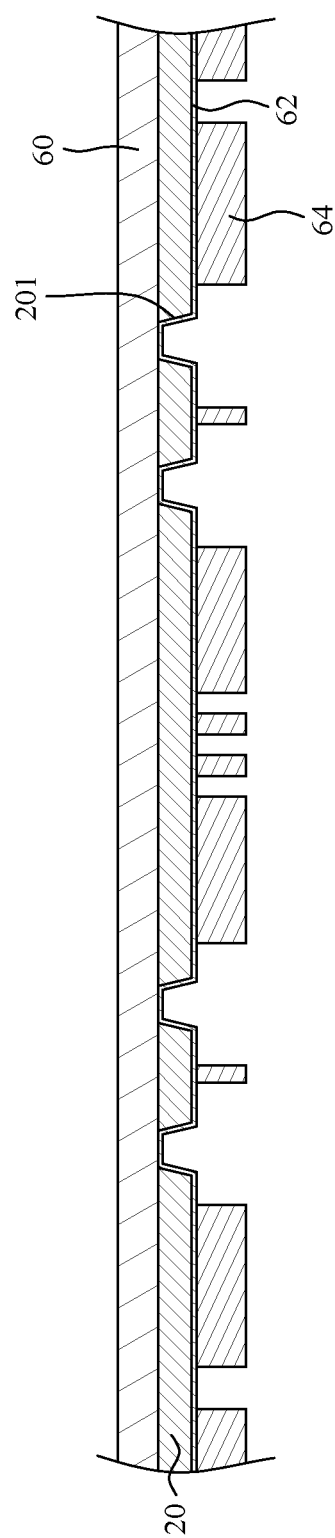
FIG. 18 illustrates one or more stages of an example of a method for manufacturing a circuit structure according to some embodiments of the present disclosure.

Referring to FIG. 18, a first photoresist layer 64 is formed or disposed on the seed layer 62. Then, the first photoresist layer 64 is patterned to form a plurality of openings to expose portions of the seed layer 62 by an exposure and development technique or other suitable techniques.

Figure 19:
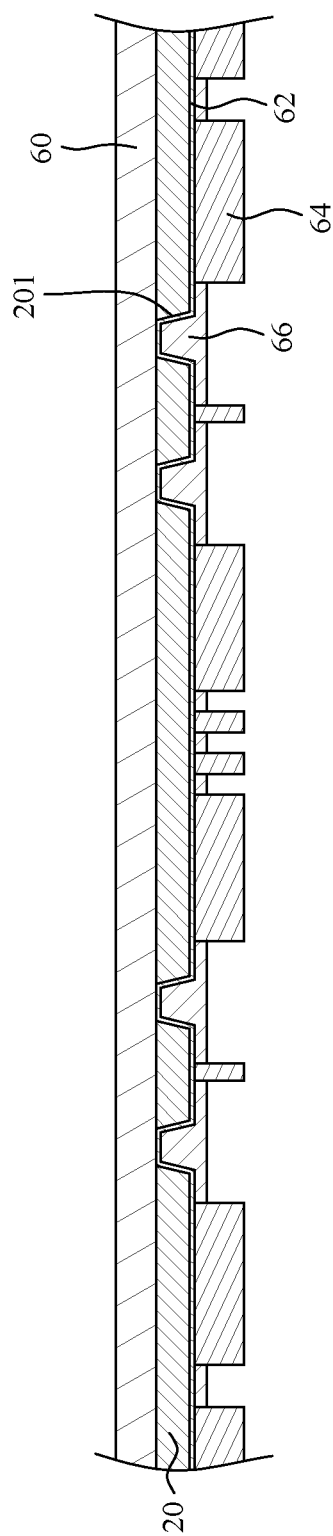
FIG. 19 illustrates one or more stages of an example of a method for manufacturing a circuit structure according to some embodiments of the present disclosure.

Referring to FIG. 19, a conductive material 66 (e.g., a metallic material) is disposed in the openings of the first photoresist layer 64 and on the seed layer 62 by a plating technique or other suitable techniques.

Figure 20:
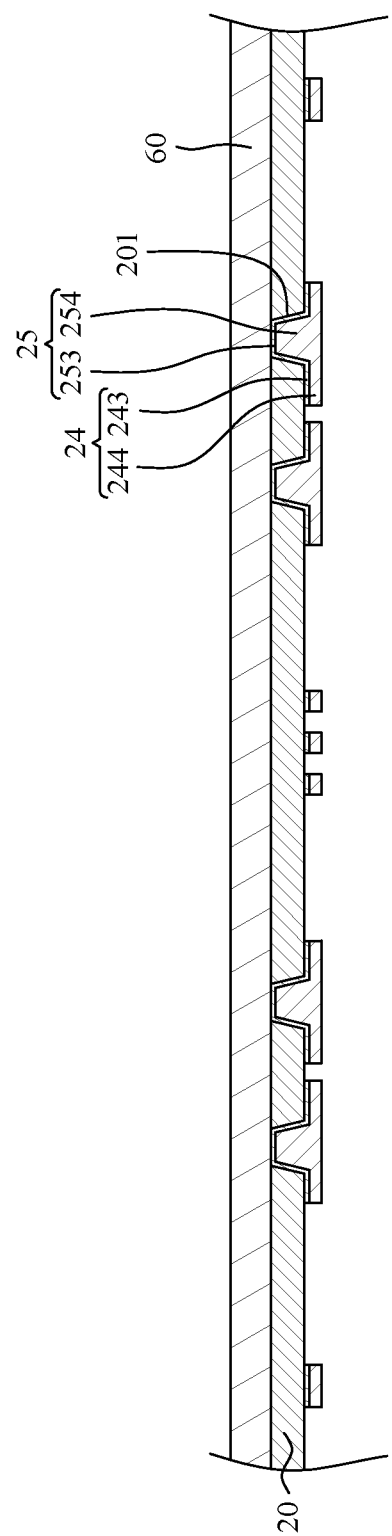
FIG. 20 illustrates one or more stages of an example of a method for manufacturing a circuit structure according to some embodiments of the present disclosure.

Referring to FIG. 20, the first photoresist layer 64 is removed by a stripping technique or other suitable techniques. Then, portions of the seed layer 62 that are not covered by the conductive material 66 are removed by an etching technique or other suitable techniques. Meanwhile, a circuit layer 24 and at least one inner conductive via 25 are formed. The circuit layer 24 is disposed on a bottom surface of the first dielectric layer 20, and include a seed layer 243 formed from the seed layer 62 and a conductive material 244 disposed on the seed layer 243 and formed from the conductive material 66. The inner conductive via 25 is disposed in the first opening 201 of the first dielectric layer 20, and includes a seed layer 253 formed from the seed layer 62 and a conductive material 254 disposed on the seed layer 253 and formed from the conductive material 66.

Figure 21:
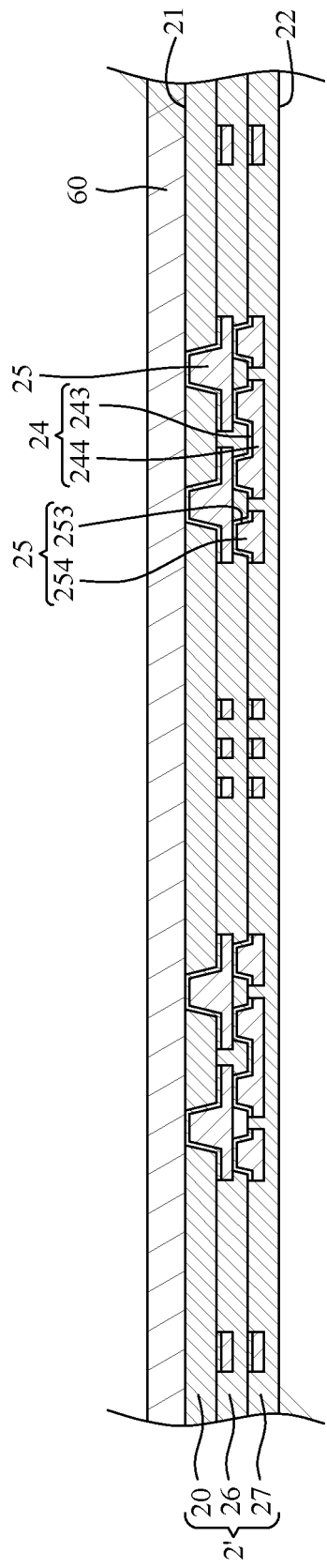
FIG. 21 illustrates one or more stages of an example of a method for manufacturing a circuit structure according to some embodiments of the present disclosure.

Referring to FIG. 21, the stages illustrated in FIG. 16 to FIG. 20 are repeated for at least one time to form an upper conductive structure 2' on the carrier 60. The upper conductive structure 2' is similar to the upper conductive structure 2.

Figure 22:
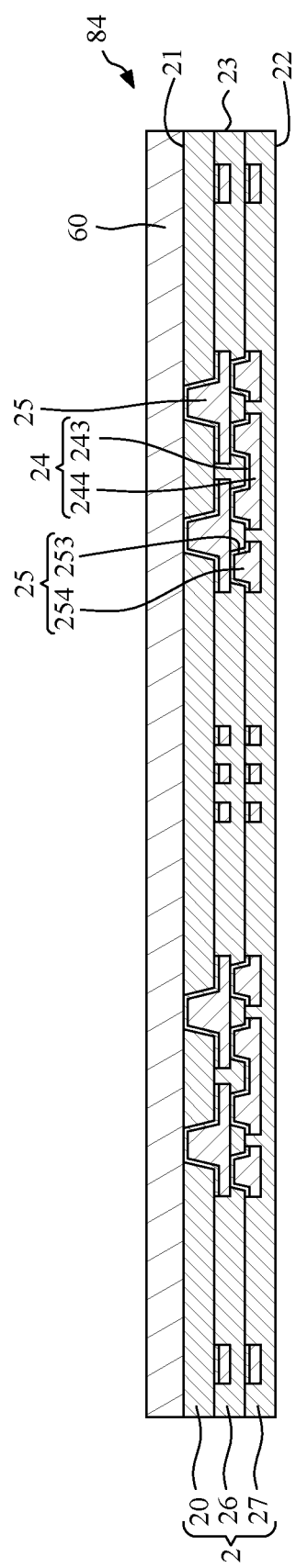
FIG. 22 illustrates one or more stages of an example of a method for manufacturing a circuit structure according to some embodiments of the present disclosure.

Referring to FIG. 22, the upper conductive structure 2' and the carrier 60 are cut to form a plurality of unit structures 84. The unit structure 84 includes an upper conductive structure 2 and a portion of the carrier 60. The upper conductive structure 2 of FIG. 22 may be the upper conductive structure 2 of FIG. 1.

Figure 23:
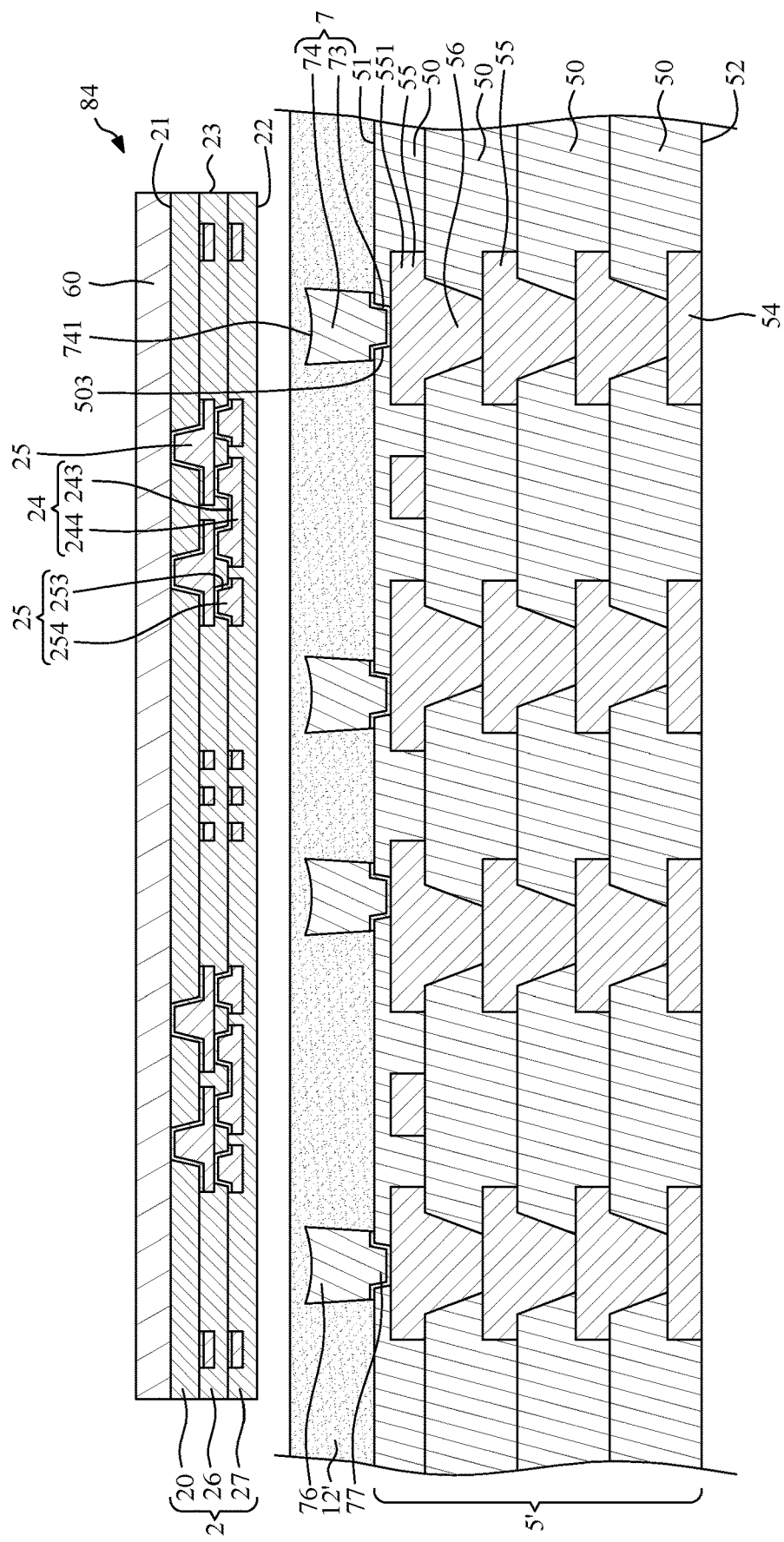
FIG. 23 illustrates one or more stages of an example of a method for manufacturing a circuit structure according to some embodiments of the present disclosure.

Referring to FIG. 23, an adhesive layer 12' is formed or applied on the top surface 51 of the lower conductive structure 5 to cover the interconnection structure 7. Then, the unit structure 84 is attached or bonded to the lower conductive structure 5'. The upper conductive structure 2 faces the lower conductive structure 5'. Thus, the upper conductive structure 2 is attached or bonded to the lower conductive structure 5' through the adhesive layer 12'. Then, the adhesive layer 12' is cured to form an intermediate layer 12'.

Figure 24:
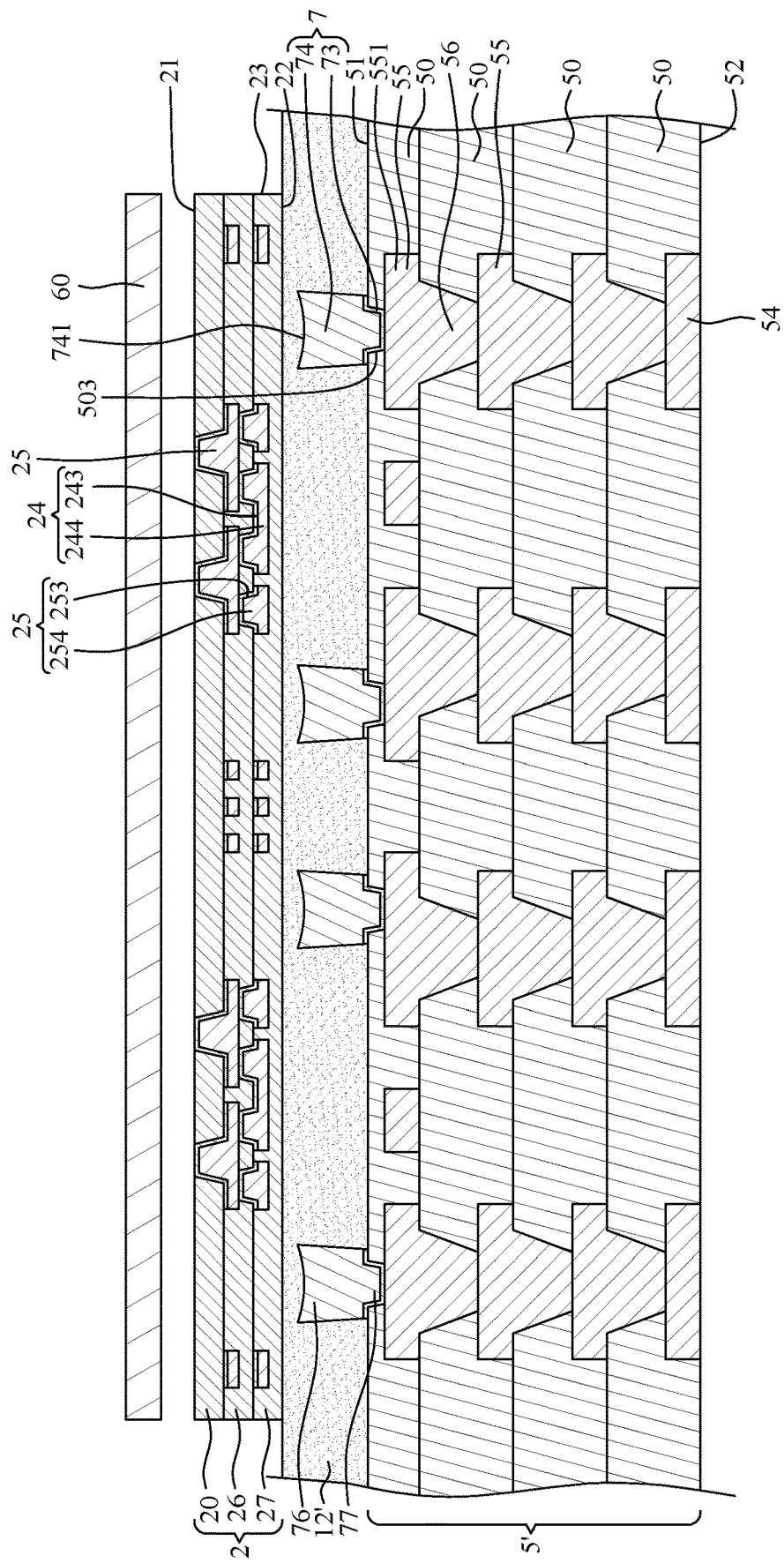
FIG. 24 illustrates one or more stages of an example of a method for manufacturing a circuit structure according to some embodiments of the present disclosure.

Referring to FIG. 24, the carrier 60 is removed.

Figure 25:
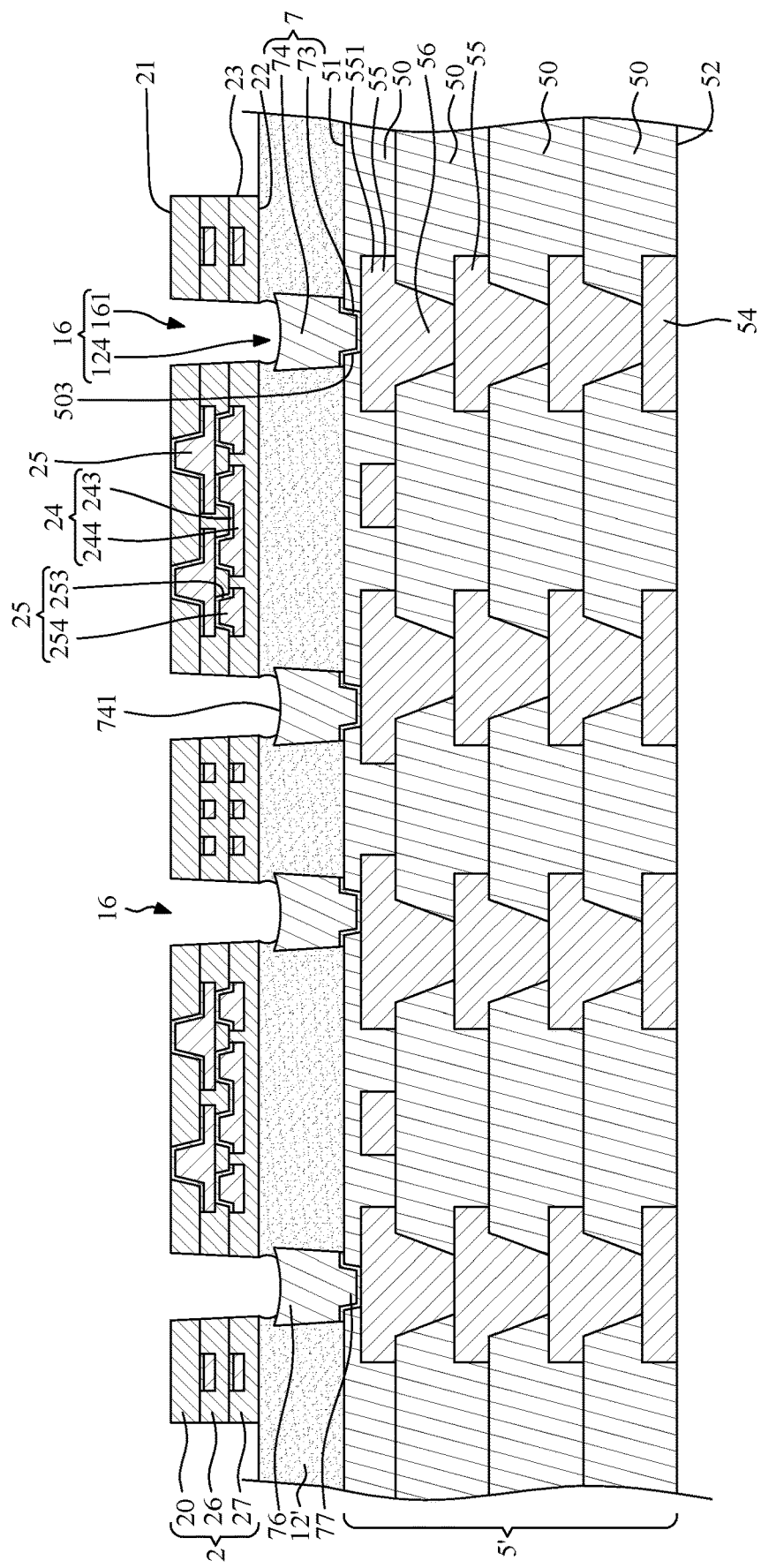
FIG. 25 illustrates one or more stages of an example of a method for manufacturing a circuit structure according to some embodiments of the present disclosure.

Referring to FIG. 25, a portion of the upper conductive structure 2 is removed to form at least one accommodating hole 16 through, for example, laser drilling or plasma etching. The accommodating hole 16 may include a through hole 161 extending through the upper conductive structure 2 and an opening 124 in the intermediate layer 12'. Thus, the accommodating hole 16 extends through the upper conductive structure 2 and extends into a portion of the intermediate layer 12', and terminates at or on a top surface 741 of the conductive material 74 of the interconnection structure 7. The accommodating hole 16 may expose a portion of the top surface 741 of the conductive material 74 of the interconnection structure 7. The accommodating hole 16 may be aligned with the interconnection structure 7.

Figure 26:
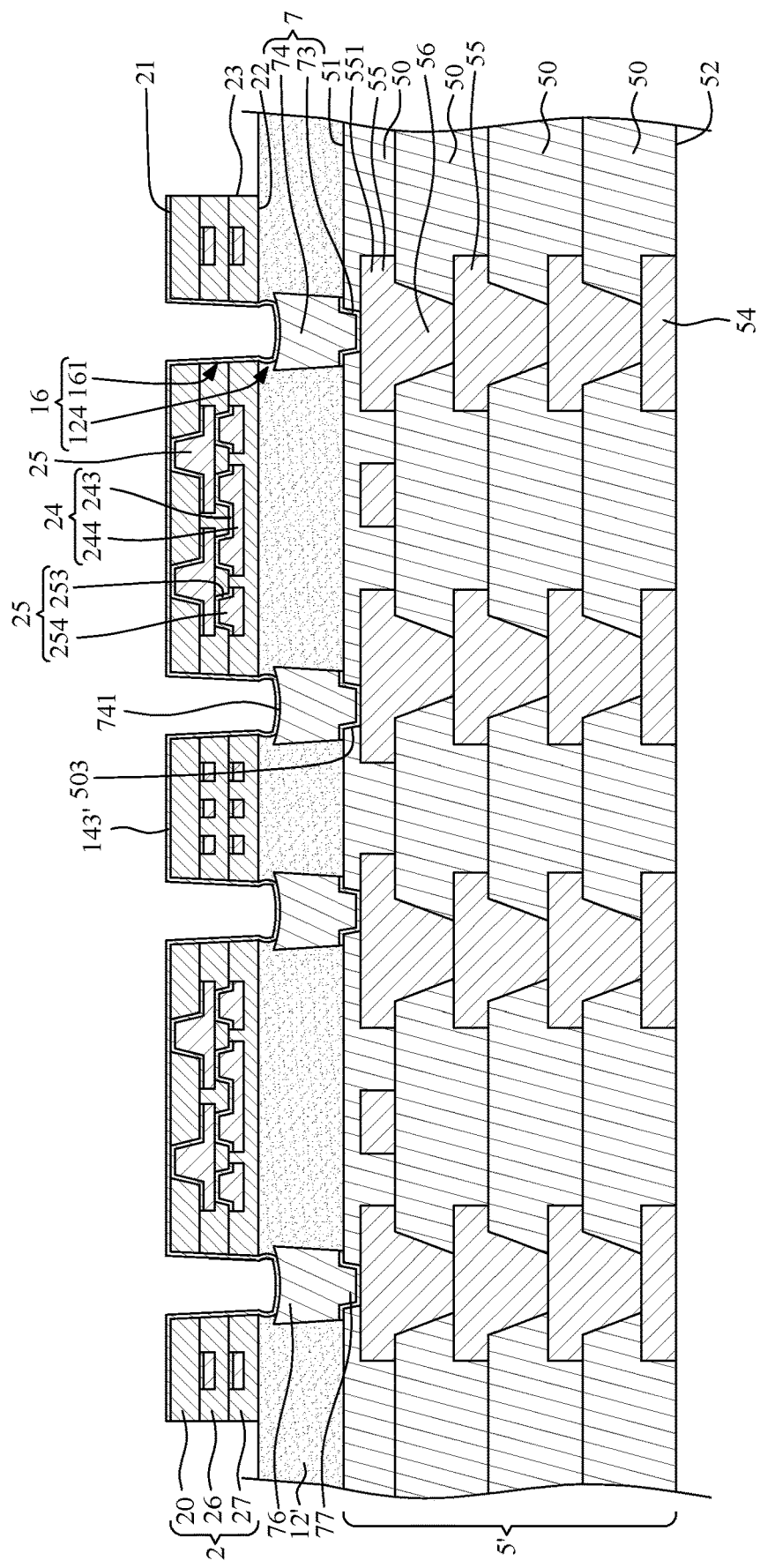
FIG. 26 illustrates one or more stages of an example of a method for manufacturing a circuit structure according to some embodiments of the present disclosure.

Referring to FIG. 26, a seed layer 143' is formed or disposed on the top surface 21 of the upper conductive structure 2 and in the accommodating hole 16.

Figure 27:
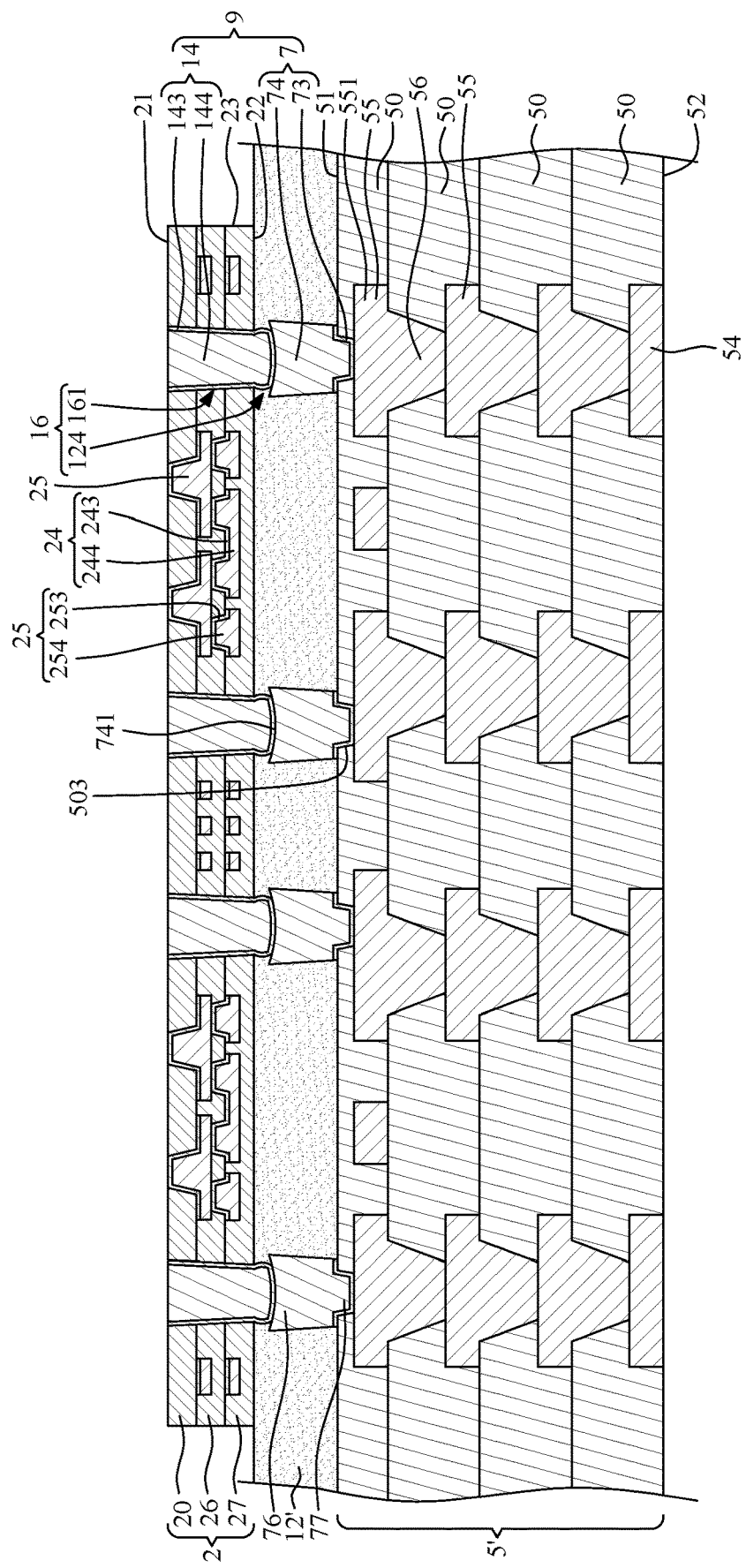
FIG. 27 illustrates one or more stages of an example of a method for manufacturing a circuit structure according to some embodiments of the present disclosure.

Referring to FIG. 27, a conductive material 144 (e.g., a metallic material) is formed or disposed to fill the accommodating hole 16 through, for example, plating, so as to form a conductive via 14 in the accommodating hole 16. The portion of the seed layer 143' outside the accommodating hole 16 is removed. The conductive via 14 extends through the upper conductive structure 2 and extends into the intermediate layer 12' to contact the top surface 741 of the conductive material 74 of the interconnection structure 7.

Then, the lower conductive structure 5' and the intermediate layer 12' are singulated so as to obtain the circuit structure 1 of FIG. 1.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, a characteristic or quantity can be deemed to be "substantially" consistent if a maximum numerical value of the characteristic or quantity is within a range of variation of less than or equal to +10% of a minimum numerical value of the characteristic or quantity, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic structure, comprising:
   a lower conductive structure;
   an upper conductive structure disposed on the lower conductive structure;
   an intermediate layer bonding the upper conductive structure and the lower conductive structure;
   an electrical connection structure electrically connecting the upper conductive structure and the lower conductive structure, wherein the electrical connection structure includes a shoulder portion located outside the lower conductive structure; and
   an electronic device disposed on the upper conductive structure, wherein the shoulder portion is closer to the upper conductive structure than the lower conductive structure is.

2. The electronic structure of claim 1, wherein the shoulder portion of the electrical connection structure is located in the intermediate layer.

3. The electronic structure of claim 1, wherein the electrical connection structure is divided into a conductive via and an interconnection structure by the shoulder portion, the conductive via is closer to the upper conductive structure than the interconnection structure is, and the conductive via tapers toward the interconnection structure.

4. The electronic structure of claim 3, wherein the interconnection structure and the lower conductive structure are metallographically distinct.

5. The electronic structure of claim 3, wherein a top surface of the interconnection structure and a lateral surface of the conductive via define the shoulder portion, and the top surface of the interconnection structure includes a recessed surface.

6. The electronic structure of claim 1, wherein the lower conductive structure is a low-density conductive structure, and the upper conductive structure is a high-density conductive structure.

7. The electronic structure of claim 3, wherein the interconnection structure tapers toward the lower conductive structure.

8. The electronic structure of claim 3, wherein a ratio of a length of the electrical connection structure to a width of the conductive via is greater than 1.3:1, and a ratio of a length of the conductive via to the width of the conductive via is less than 1.3:1.

9. The electronic structure of claim 5, wherein the lateral surface of the conductive via includes a curved surface.

10. An electronic structure, comprising:
    a lower conductive structure;
    an upper conductive structure disposed over the lower conductive structure;
    an intermediate layer disposed between the upper conductive structure and the lower conductive structure; and
    an electrical connection structure extending through the upper conductive structure and electrically connecting to the lower conductive structure, wherein the electrical connection structure includes a boundary surface disposed in the intermediate layer, wherein the boundary surface includes a recessed surface.

11. The electronic structure of claim 10, wherein the recessed surface is recessed toward the lower conductive structure.

12. The electronic structure of claim 10, wherein the electrical connection structure includes a conductive via and an interconnection structure, and the boundary surface is disposed between the conductive via and the interconnection structure.

13. The electronic structure of claim 12, wherein a vertical projection of the conductive via is non-overlapped with a pad of the lower conductive structure.

14. The electronic structure of claim 12, wherein the interconnection structure includes a connecting portion extending along a direction substantially parallel with a top surface of the lower conductive structure.

15. The electronic structure of claim 12, wherein the intermediate layer covers a portion of a top surface of the interconnection structure.

16. The electronic structure of claim 12, wherein a central axis of the conductive via is shifted from a central axis of a pad of the lower conductive structure.

17. The electronic structure of claim 10, wherein the electrical connection structure further includes a seed layer disposed on the boundary surface.

* * * * *